United States Patent
Moriyama et al.

(10) Patent No.: US 10,123,433 B2
(45) Date of Patent: Nov. 6, 2018

(54) CARRIER-ATTACHED COPPER FOIL, LAMINATE, METHOD FOR MANUFACTURING PRINTED-WIRING BOARD AND METHOD FOR MANUFACTURING ELECTRONIC DEVICE

(71) Applicant: JX Nippon Mining & Metals Corporation, Tokyo (JP)

(72) Inventors: Terumasa Moriyama, Ibaraki (JP); Tomota Nagaura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 18 days.

(21) Appl. No.: 15/218,449

(22) Filed: Jul. 25, 2016

(65) Prior Publication Data
US 2017/0034926 A1   Feb. 2, 2017

(30) Foreign Application Priority Data

Jul. 27, 2015  (JP) ................................ 2015-148173
Feb. 16, 2016  (JP) ................................ 2016-027055

(51) Int. Cl.
| | | |
|---|---|---|
| B21C 37/00 | (2006.01) | |
| H05K 3/46 | (2006.01) | |
| H05K 1/09 | (2006.01) | |
| H05K 3/00 | (2006.01) | |
| H05K 3/02 | (2006.01) | |
| H05K 3/40 | (2006.01) | |

(52) U.S. Cl.
CPC ............ *H05K 3/4652* (2013.01); *H05K 1/09* (2013.01); *H05K 3/4682* (2013.01); *H05K 3/007* (2013.01); *H05K 3/025* (2013.01); *H05K 3/4007* (2013.01); *Y10T 428/12431* (2015.01); *Y10T 428/12438* (2015.01)

(58) Field of Classification Search
None
See application file for complete search history.

(56) References Cited

U.S. PATENT DOCUMENTS

| | | |
|---|---|---|
| 5,431,803 A | 7/1995 | DiFranco et al. |
| 7,026,059 B2 | 4/2006 | Suzuki et al. |

(Continued)

FOREIGN PATENT DOCUMENTS

| | | |
|---|---|---|
| EP | 1152070 A1 | 11/2001 |
| JP | 3261119 B2 | 2/2002 |

(Continued)

OTHER PUBLICATIONS

Office action dated Nov. 15, 2017 in co-pending U.S. Appl. No. 15/218,466.

(Continued)

*Primary Examiner* — Seth Dumbris
(74) *Attorney, Agent, or Firm* — Nields, Lemack & Frame, LLC

(57) ABSTRACT

A carrier-attached copper foil having good circuit formability is provided. The carrier-attached copper foil has a carrier, an intermediate layer and an ultra-thin copper layer in this order, the number of crystal grains per unit cross-sectional area of the ultra-thin copper layer in the through-thickness direction is 0.1 to 5 grains/$\mu m^2$, and a ten point average roughness Rz of a surface on a side of the ultra-thin copper layer is 0.1 to 2.0 μm.

24 Claims, 5 Drawing Sheets

(56) References Cited

U.S. PATENT DOCUMENTS

| | | |
|---|---|---|
| 2001/0042732 A1 | 11/2001 | Yamamoto et al. |
| 2003/0148136 A1 | 8/2003 | Yamamoto et al. |
| 2004/0038049 A1 | 2/2004 | Suzuki et al. |
| 2004/0067377 A1 | 4/2004 | Sugimoto et al. |
| 2004/0241487 A1 | 12/2004 | Nagatani |
| 2005/0048306 A1 | 3/2005 | Suzuki et al. |
| 2005/0158574 A1 | 7/2005 | Suzuki et al. |
| 2010/0084275 A1 | 4/2010 | Hanafusa |
| 2011/0262764 A1* | 10/2011 | Arai .................. C25D 5/00 428/551 |
| 2011/0311834 A1 | 12/2011 | Hanafusa |
| 2013/0220679 A1 | 8/2013 | Kawakami |
| 2016/0183380 A1 | 6/2016 | Ishii et al. |
| 2017/0019991 A1 | 1/2017 | Miyamoto et al. |
| 2017/0032978 A1 | 2/2017 | Moriyama et al. |
| 2017/0042025 A1 | 2/2017 | Miyamoto |
| 2017/0042036 A1 | 2/2017 | Miyamoto |
| 2017/0042044 A1 | 2/2017 | Miyamoto |

FOREIGN PATENT DOCUMENTS

| | | |
|---|---|---|
| JP | 2005-161840 A | 6/2005 |
| JP | 2006-22406 A | 1/2006 |
| JP | 2006-346874 A | 12/2006 |
| JP | 2007-7937 A | 1/2007 |
| JP | 2010-6071 A | 1/2010 |
| JP | 5352748 B1 | 11/2013 |
| JP | 2014-100905 A | 6/2014 |
| JP | 2014-131808 A | 7/2014 |
| JP | 2014-208910 A | 11/2014 |
| JP | 2015-42765 A | 3/2015 |
| JP | 2015-61938 A | 4/2015 |
| JP | 2016-89193 A | 5/2016 |
| KR | 2014-0053797 A | 5/2014 |
| WO | 2004/005588 A1 | 1/2004 |
| WO | 2012/046804 A1 | 4/2012 |
| WO | 2014/065430 A1 | 5/2014 |
| WO | 2014/196576 A1 | 12/2014 |
| WO | 2015/012327 A1 | 1/2015 |
| WO | 2015/108191 A1 | 7/2015 |

OTHER PUBLICATIONS

Office action dated Aug. 25, 2017 in co-pending U.S. Appl. No. 15/218,466.
Office action dated Mar. 26, 2018 in co-pending U.S. Appl. No. 15/209,930.
Office action dated May 10, 2018 in co-pending U.S. Appl. No. 15/229,203.
Final rejection dated Mar. 12, 2018 in co-pending U.S. Appl. No. 15/218,466.
Office action dated May 21, 2018 in co-pending U.S. Appl. No. 15/229,203.
Notice of allowance dated Jun. 25, 2018 in co-pending U.S. Appl. No. 15/218,466.
Office action dated Jun. 15, 2018 in co-pending U.S. Appl. No. 15/229,194.
Office action dated Jul. 11, 2018 in co-pending U.S. Appl. No. 15/229,197.

* cited by examiner

CARRIER-ATTACHED COPPER FOIL, LAMINATE, METHOD FOR MANUFACTURING PRINTED-WIRING BOARD AND METHOD FOR MANUFACTURING ELECTRONIC DEVICE

TECHNICAL FIELD

The present invention relates to a carrier-attached copper foil, a laminate, a method for manufacturing a printed wiring board and a method for manufacturing an electronic device.

BACKGROUND ART

Printed wiring boards have made great progress over this half century, which have led to their use in almost all electronic devices today. With increasing needs for downsizing and higher performance of electronic devices in recent years, higher-density packaging of mounted components and higher frequencies of signals have progressed, thus miniaturization (finer pitch) of conductor patterns and adaptation to high frequencies are needed in printed wiring boards. In particular, if an IC chip is mounted on a printed wiring board, a finer pitch of L (Line)/S (Space)=20 µm/20 µm or less is required.

A printed wiring board is firstly manufactured as a copper-clad laminate obtained by bonding a copper foil and an insulating substrate, which mainly include a glass epoxy substrate, a BT resin and a polyimide film. The bonding is performed by using a method of laminating an insulating substrate and a copper foil and heating and pressuring the resultant (lamination process), or a method of applying a varnish which is a precursor of an insulating substrate material to one side of a copper foil having a cover layer, and then heating and curing the resultant (casting process).

The thickness of a copper foil used for a copper-clad laminate is made thinner in association with a finer pitch, in such a way that the foil thickness has become 9 µm, further 5 µm or less. However, when the foil thickness is 9 µm or smaller, handling ability is greatly deteriorated in forming a copper-clad laminate by the afore-mentioned lamination process or casting process. To deal with the problem, carrier-attached copper foils have emerged utilizing a thick metal foil as a carrier, and having an ultra-thin copper layer formed thereon via a release layer. General methods of using the carrier-attached copper foil include bonding the surface of the ultra-thin copper layer to an insulating substrate, bonding the resultant by thermocompression, and then detaching the carrier via the release layer, as disclosed in Patent Literature 1, etc.

In the production of a printed wiring board using the carrier-attached copper foil, a typical method of using the carrier-attached copper foil includes firstly laminating the carrier-attached copper foil to an insulating substrate, and then detaching the carrier from the ultra-thin copper layer. Next, a plating resist formed of a photo-curable resin is provided on the ultra-thin copper layer exposed as a result of detaching the carrier. Next, predetermined areas of the plating resist are cured by exposing the areas to light. Subsequently, the uncured plating resist at unexposed areas are removed, and then an electrolytic plating layer is provided at the areas in which the resist is removed. Next, the cured plating resist is removed, thereby obtaining the insulating substrate having a circuit formed thereon, and this is used to produce the printed wiring board.

CITATION LIST

Patent Literature

[Patent Literature 1] Japanese Patent Laid-Open Application No. 2006-022406

SUMMARY OF INVENTION

Technical Problem

Regarding a method of producing a printed wiring board, various methods have also been developed and utilized in recent years for different purposes. For example, An embedded trace substrate (ETS) such as a printed wiring board is produced by so-called an embedding process that includes forming circuit plating on a surface of an ultra-thin copper layer of a carrier-attached copper foil, laminating a resin layer by providing embedding resin on the ultra-thin copper layer so as to cover the formed circuit plating (so as to bury the formed circuit plating), drilling holes on the resin layer at prescribed locations, forming blind vias by exposing the circuit plating, and connecting circuits and wiring between plural layers of the laminate.

For the formation of an embedded trace substrate etc., a circuit is formed by copper plating on an ultra-thin copper layer. At that time, in order to secure adhesion with a dry film (plating resist), chemical etching treatment is performed on the ultra-thin copper layer to roughen a surface of the ultra-thin copper layer. Because such chemical etching preferentially proceeds at portions near crystal grain boundaries that are exposed on the surface of the ultra-thin copper layer, the thickness of the ultra-thin copper layer may become non-uniform after the etching depending on the crystalline structure that forms the ultra-thin copper layer. Degradation of uniformity causes excessive etching and may result in adverse effect on circuit accuracy.

In view of the above, it is an object of the present invention to provide a carrier-attached copper foil with good circuit formability.

Solution to Problem

The present inventor intensively conducted studies in order to achieve the above object and found that the circuit formability can be improved by controlling the number of crystal grains per unit cross-sectional area of the ultra-thin copper layer in the through-thickness direction and surface roughness of a surface on the side of the ultra-thin copper layer.

The present invention was accomplished based on the above finding, and according to an aspect, the present invention is a carrier-attached copper foil having a carrier, an intermediate layer and an ultra-thin copper layer in this order, and the number of crystal grains per unit cross-sectional area of the ultra-thin copper layer in the through-thickness direction is 0.1 to 5 grains/$\mu m^2$ and a ten point average roughness Rz of the surface on the side of the ultra-thin copper layer is 0.1 to 2.0 µm.

In an embodiment of the carrier-attached copper foil of the present invention, the ten point average roughness Rz of the surface on the side of the ultra-thin copper layer is 0.11 to 1.9 µm.

In another embodiment of the carrier-attached copper foil of the present invention, the ten point average roughness Rz of the surface on the side of the ultra-thin copper layer is 0.12 to 1.8 µm.

In another embodiment of the carrier-attached copper foil of the present invention, the number of crystal grains per unit cross-sectional area of the ultra-thin copper layer in the through-thickness direction is 0.2 to 4.8 grains/μm².

In another embodiment of the carrier-attached copper foil of the present invention, the number of crystal grains per unit cross-sectional area of the ultra-thin copper layer in the through-thickness direction is 0.3 to 4.5 grains/μm².

In another embodiment of the carrier-attached copper foil of the present invention, the average grain size of crystal grains that form the ultra-thin copper layer is 0.5 to 6.0 μm.

In another embodiment of the carrier-attached copper foil of the present invention, the average grain size of crystal grains that form the ultra-thin copper layer is 0.6 to 5.8 μm.

In another embodiment of the carrier-attached copper foil of the present invention, the average grain size of crystal grains that form the ultra-thin copper layer is 0.7 to 5.6 μm.

In another embodiment, the carrier-attached copper foil of the present invention is used for manufacturing a coreless printed wiring board.

In another embodiment, the carrier-attached copper foil of the present invention has at least one layer selected from a group of a roughened layer, a heat-resistant layer, a rust-proofing layer, a chromate treated layer, and a silane coupling-treated layer, and when the carrier-attached copper foil of the present invention has the ultra-thin copper layer on one face of the carrier, the at least one layer is on at least one or both of a surface on a side of the ultra-thin copper layer and a surface on a side of the carrier, or when the carrier-attached copper foil of the present invention has the ultra-thin copper layer on each of both faces of the carrier, the at least one layer is on one or both of surfaces on sides of the ultra-thin copper layer.

In another embodiment of the carrier-attached copper foil of the present invention, the roughened layer is a layer of an alloy including any one or at least one selected from a group consisting of copper, nickel, phosphorus, tungsten, arsenic, molybdenum, chromium, titanium, iron, vanadium, cobalt, and zinc.

In another embodiment, the carrier-attached copper foil of the present invention has a resin layer on the at least one layer selected from the group of the roughened layer, the heat-resistant layer, the rustproofing layer, the chromate treated layer, and the silane coupling-treated layer.

In another embodiment of the carrier-attached copper foil of the present invention, a resin layer is provided on the ultra-thin copper layer.

In another embodiment, the present invention is a laminate comprising the carrier-attached copper foil of the present invention.

In another embodiment, the present invention is a laminate comprising the carrier-attached copper foil of the present invention and a resin, and a portion or all of edge faces of the carrier-attached copper foil is covered with the resin.

In another embodiment, the present invention is a laminate comprising two carrier-attached copper foils of the present invention and a resin, and the two carrier-attached copper foils are provided on the resin so that a surface on a side of the ultra-thin copper layer of one carrier-attached copper foil of the two carrier-attached copper foils and a surface on a side of the ultra-thin copper layer of another carrier-attached copper foil are exposed.

In another embodiment, the present invention is a laminate in which the carrier-attached copper foil of the present invention is laminated from a side of the carrier or a side of the ultra-thin copper layer on a side of the carrier or a side of the ultra-thin copper layer of another carrier-attached copper foil of the present invention.

In another embodiment, the present invention is a printed wiring board manufacturing method of manufacturing a printed wiring board by using the carrier-attached copper foil of the present invention.

In another embodiment, the present invention is a method of manufacturing a printed wiring board including a step of preparing the carrier-attached copper foil of the present invention and an insulating substrate, a step of laminating the carrier-attached copper foil and the insulating substrate, a step of detaching the carrier from the carrier-attached copper foil after the carrier-attached copper foil and the insulating substrate are laminated to form a copper-clad laminate, and a step of forming a circuit by any one of a semi-additive method, a subtractive method, a partly additive method, and a modified semi-additive method.

In another embodiment, the present invention is a method of manufacturing a printed wiring board including a step of forming a circuit on a surface on a side of the ultra-thin copper layer or a surface on a side of the carrier of the carrier-attached copper foil of the present invention, a step of forming a resin layer on the surface on the side of the ultra-thin copper layer or the surface on the side of the carrier of the carrier-attached copper foil so that the circuit is buried, a step of detaching the carrier or the ultra-thin copper layer after forming the resin layer, and a step of exposing, after detaching the carrier or the ultra-thin copper layer, the circuit that is formed on the surface on the side of the ultra-thin copper layer or the surface on the side of the carrier and is buried in the resin layer by removing the carrier or the ultra-thin copper layer.

In another embodiment, the present invention is a method of manufacturing a printed wiring board including a step of forming a circuit on a surface on a side of the ultra-thin copper layer or a surface on a side of the carrier of the carrier-attached copper foil of the present invention, a step of forming a resin layer on the surface on the side of the ultra-thin copper layer or the surface on the side of the carrier of the carrier-attached copper foil so that the circuit is buried, a step of forming a circuit on the resin layer, a step of detaching the carrier or the ultra-thin copper layer after forming the circuit on the resin layer, and a step of exposing, after detaching the carrier or the ultra-thin copper layer, the circuit that is formed on the surface on the side of the ultra-thin copper layer or the surface on the side of the carrier and is buried in the resin layer by removing the carrier or the ultra-thin copper layer.

In another embodiment, the present invention is a method of manufacturing a printed wiring board including a step of laminating the carrier-attached copper foil of the present invention on a resin substrate so as to attach a side of the carrier to the resin substrate, a step of forming a circuit on the surface on the side of the ultra-thin copper layer of the carrier-attached copper foil, a step of forming a resin layer on the surface on the side of the ultra-thin copper layer of the carrier-attached copper foil so that the circuit is buried, a step of detaching the carrier after forming the resin layer, and a step of exposing, after detaching the carrier, the circuit that is formed on the surface on the side of the ultra-thin copper layer and is buried in the resin layer by removing the ultra-thin copper layer.

In another embodiment, the present invention is a method of manufacturing a printed wiring board including a step of laminating the carrier-attached copper foil of the present invention on a resin substrate so as to attach a side of the carrier to the resin substrate, a step of forming a circuit on the surface on the side of the ultra-thin copper layer of the carrier-attached copper foil, a step of forming a resin layer on the surface on the side of the ultra-thin copper layer of the carrier-attached copper foil so that the circuit is buried, a step of forming a circuit on the resin layer, a step of detaching the carrier after forming the circuit on the resin layer, and a step of exposing, after detaching the carrier, the circuit that is formed on the surface on the side of the ultra-thin copper layer and is buried in the resin layer by removing the ultra-thin copper layer.

In another embodiment, the present invention is a method of manufacturing a printed wiring board including a step of laminating the carrier-attached copper foil of the present invention on a resin substrate so as to attach a surface on a side of the ultra-thin copper layer or a surface on a side of the carrier to the resin substrate, a step of providing two layers including a resin layer and a circuit at least once on the surface on the side of the ultra-thin copper layer or the surface on the side of the carrier of the carrier-attached copper foil, the surface on the side of the ultra-thin copper layer or the surface on the side of the carrier being an opposite side of a side to which the resin substrate is laminated, and a step of detaching the carrier or the ultra-thin copper layer from the carrier-attached copper foil after forming the two layers including the resin layer and the circuit.

In another embodiment, the method of manufacturing a printed wiring board of the present invention includes a step of laminating the carrier-attached copper foil of the present invention on a resin substrate so as to attach a surface on a side of the carrier to the resin substrate, a step of providing two layers including a resin layer and a circuit at least once on the surface on the side of the ultra-thin copper layer of the carrier-attached copper foil, the surface on the side of the ultra-thin copper layer being an opposite side of a side to which the resin substrate is laminated, and a step of detaching the carrier from the carrier-attached copper foil after forming the two layers including the resin layer and the circuit.

In another embodiment, the present invention is a method of manufacturing a printed wiring board including a step of providing two layers including a resin layer and a circuit at least once on any one of or both of faces of the laminate of the present invention, and a step of detaching the carrier and the ultra-thin copper layer from the carrier-attached copper foil that forms the laminate after forming the two layers including the resin layer and the circuit.

In another embodiment, the present invention is an electronic device manufacturing method of manufacturing an electronic device by using a printed wiring board manufactured by the method of the present invention.

Advantageous Effect of Invention

According to the present invention, it is possible to provide a carrier-attached copper foil having good circuit formability.

DESCRIPTION OF EMBODIMENTS

Carrier-Attached Copper Foil

Figure 1:
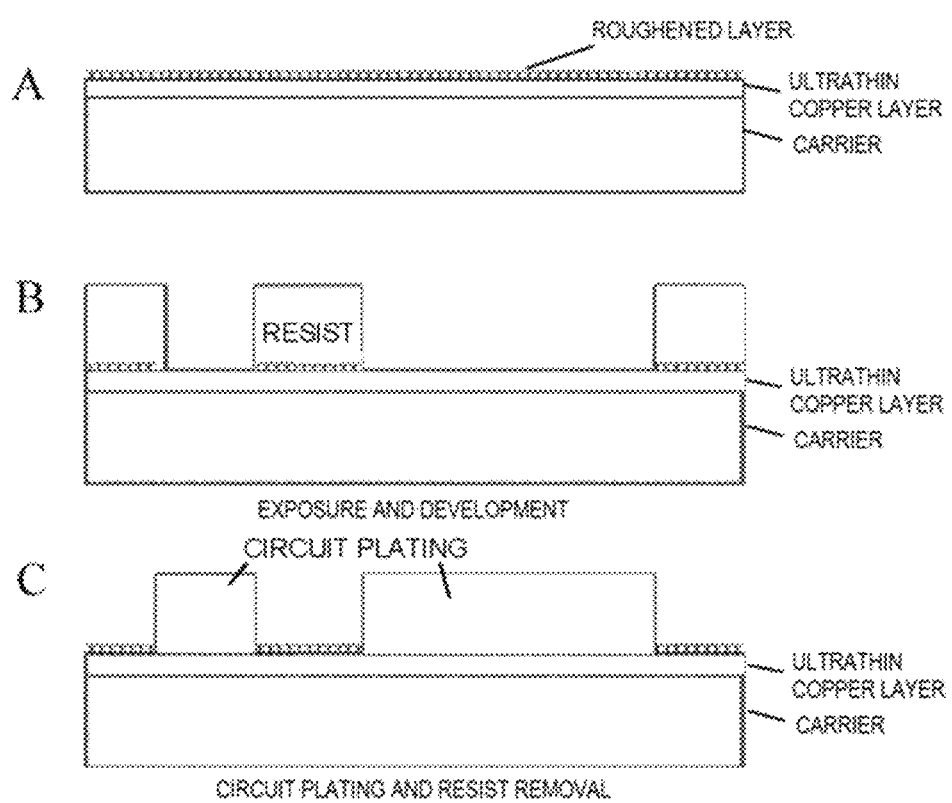
FIG. 1A-C is a schematic cross-sectional view of a wiring board at the steps up to the circuit plating/removal of the resist according to a specific example of the method of manufacturing a printed wiring board using the carrier-attached copper foil of the invention.

A carrier-attached copper foil of the present invention has a carrier, an intermediate layer and an ultra-thin copper layer laminated in this order. Methods of using carrier-attached copper foils per se are well-known to those skilled in the art. For example, the surface of the ultra-thin copper layer is bonded to an insulating substrate such as a paper based phenol resin, a paper based epoxy resin, a synthetic fiber cloth-based epoxy resin, a glass cloth/paper composite based epoxy resin, a glass cloth/non-woven glass cloth composite based epoxy resin and a glass cloth based epoxy resin, a polyester film and a polyimide film. After the resultant is thermocompression bonded, the carrier is detached. The ultra-thin copper layer adhered to the insulating substrate is etched to a target conductor pattern, and finally, a printed wiring board can be manufactured.

<Carrier>

The carrier that can be used in the present invention is typically a metal foil or a resin film and is provided in the form of e.g., a copper foil, a copper-alloy foil, a nickel foil, a nickel-alloy foil, an iron foil, an iron-alloy foil, a stainless steel foil, an aluminum foil, an aluminum-alloy foil or an insulating resin film, a polyimide film, and an LCP (Liquid Crystal Polymer) film, a fluorine resin film, a polyethylene terephthalate (PET) film, a polypropylene (PP) film, a polyamide film, and a polyamide-imide film.

The carrier that can be used in the present invention is typically provided in the form of a rolled copper foil and an electrolytic copper foil. In general, The electrolytic copper foil is produced by electrolytic deposition of copper on a drum formed of titanium and stainless steel from a copper sulfate plating bath, whereas the rolled copper foil is produced by repeating plastic working by a mill roll and heat treatment. As the material for the copper foil, not only high-purity copper such as tough pitch copper (JIS H3100 Alloy Number C1100) and oxygen-free copper (JIS H3100 Alloy Number C1020 or JIS H3510 Alloy Number C1011) but also a copper alloy such as Sn-containing copper, Ag-containing copper, a copper alloy containing Cr, Zr, or Mg, etc. and a Corson copper alloy containing Ni, Si and so forth can be used. Note that, in this specification, the term "copper foil" as used singly also includes a copper-alloy foil.

The thickness of the carrier that can be used in the present invention is not particularly limited but may be controlled to be such an appropriate thickness that allows the carrier to play a role. For example, the thickness may be 5 µm or more. However, if the carrier is too thick, the production cost increases. Thus, generally, the thickness of the carrier is preferably 35 µm or less. Accordingly, the thickness of the carrier is typically 8 to 70 µm, more typically 12 to 70 µm and more typically 18 to 35 µm. In addition, with the objective of reducing the raw material cost, a thinner carrier is preferable. For that reason, the thickness of the carrier is typically 5 to 35 µm, preferably 5 to 18 µm, preferably 5 to 12 µm, preferably 5 to 11 µm, and preferably 5 to 10 µm. Note that in a case of a thin carrier, creases are likely to be formed when such a carrier passes through machinery for processing. In order to prevent the creases, smoothing a carrying roll of a carrier-attached copper foil manufacturing equipment or reducing a distance between carrying rolls as an example are effective. Note that when a carrier-attached copper foil is used in the Embedded Process, which is one of manufacturing methods of a printed-wiring board, the carrier needs to have high rigidity. For that reason, when a carrier-attached copper foil is used in the Embedded Process, the thickness of the carrier is preferably 18 to 300 µm, preferably 25 to 150 µm, preferably 35 to 100 µm, and more preferably 35 to 70 µm.

Note that a roughened layer may be provided on one surface of the carrier that is on the other side of another surface on which an ultra-thin copper layer is provided. This roughened layer may be provided by using known methods or may be provided by using the roughening treatment described later. An advantage of providing a roughened layer on one surface of the carrier that is on the other side of a surface on which an ultra-thin copper layer is provided is that at the time of depositing the carrier on a support such as a resin substrate on a surface that has the roughened layer, the carrier and the resin substrate are not easily detached from each other.

<Intermediate Layer>

An intermediate layer is provided on one or both surfaces of the carrier. Another layer or other layers may be provided between the carrier and the intermediate layer. The intermediate layer to be used in the present invention is not particularly limited as long as the ultra-thin copper layer is not easily detached from the carrier before a carrier-attached copper foil is laminated on an insulating substrate; whereas the ultra-thin copper layer is easily detached from the carrier after the carrier-attached copper foil is laminated on an insulating substrate. The intermediate layer of the carrier-attached copper foil of the present invention may contain, for example, one or more selected from a group consisting of Cr, Ni, Co, Fe, Mo, Ti, W, P, Cu, Al, Zn, an alloy of any of these elements, a hydrate of any of these elements, an oxide of any of these elements and an organic compound. Furthermore, the intermediate layer may be formed of a single layer or a plurality of layers.

For example, the intermediate layer can be composed of a layer on the carrier side including any one of a single metal layer formed of a single element selected from a group of elements consisting of Cr, Ni, Co, Fe, Mo, Ti, W, P, Cu, Al and Zn, an alloy layer formed of at least one element selected from a group of elements consisting of Cr, Ni, Co, Fe, Mo, Ti, W, P, Cu, Al and Zn, and an organic compound layer, and a layer over the layer on the carrier side including any one of a layer formed of a hydrate or an oxide of at least one element selected from the a group of elements consisting of Cr, Ni, Co, Fe, Mo, Ti, W, P, Cu, Al and Zn, a single metal layer formed of a single element of a group of elements consisting of Cr, Ni, Co, Fe, Mo, Ti, W, P, Cu, Al and Zn, and an alloy layer formed of at least one element selected from a group of elements consisting of Cr, Ni, Co, Fe, Mo, Ti, W, P, Cu, Al and Zn.

In the case where the intermediate layer is provided only one of the surfaces of a carrier, a rustproofing layer such as a Ni-plated layer is preferably provided on the opposite surface of the carrier. Note that, in the case where the intermediate layer is provided by a chromate treatment, a zinc-chromate treatment or plating, it is believed that a part of attached metal such as chromium or zinc could form a hydrate or oxide in some cases.

The intermediate layer can be formed, for example, by depositing on the carrier, nickel, a nickel-phosphorus alloy or a nickel-cobalt alloy and chromium in this order from the carrier. Since the adhesive force between nickel and copper is higher than the adhesive force between chromium and copper, when an ultra-thin copper layer is detached, the ultra-thin copper layer can be detached at the interface between the ultra-thin copper layer and the chromium. The nickel contained in the intermediate layer is expected to exert a barrier effect that prevents diffusion of a copper component of the carrier into the ultra-thin copper layer. The deposition amount of nickel in the intermediate layer is preferably 100 µg/dm² or more and 40000 µg/dm² or less, more preferably 100 µg/dm² or more and 4000 µg/dm² or less, more preferably 100 µg/dm² or more and 2500 µg/dm² or less, and more preferably 100 µg/dm² or more and less than 1000 µg/dm². The deposition amount of chromium in the intermediate layer is preferably 5 µg/dm or more and 100 µg/dm² or less. In the case where the intermediate layer is provided only one of the surfaces of a carrier, a rustproofing layer such as a Ni-plated layer is preferably provided on the opposite surface of the carrier.

<Ultra-Thin Copper Layer>

An ultra-thin copper layer is provided on the intermediate layer. Another layer or other layers may be provided between the intermediate layer and the ultra-thin copper layer.

The ultra-thin copper layer can be formed by electroplating utilizing an electrolytic bath of copper sulfate, copper pyrophosphate, copper sulfamate, copper cyanide or the like. A copper sulfate bath is preferred because it is used for general electrolytic copper foils, and it enables formation of copper foils at high current densities. The thickness of the ultra-thin copper layer is not particularly limited, but the ultra-thin copper layer is generally thinner than the carrier, and an example is 12 µm or less. The thickness is typically 0.1 to 12 µm, more typically 0.5 to 12 µm, more typically 1 to 5 µm, further typically 1.5 to 5 µm and further typically 2 to 5 µm. Note that the ultra-thin copper layer may be provided on both surfaces of the carrier. A layer or layers having a configuration which can be used as the intermediate layer may be used for the other layer or the other layers.

The carrier-attached copper foil of the present invention can be used to produce a laminate (copper-clad laminate, etc.). Examples of such a laminate include a configuration of "an ultra-thin copper layer/an intermediate layer/a carrier/a resin or prepreg" laminated in this order, a configuration of "a carrier/an intermediate layer/an ultra-thin copper layer/a resin or prepreg" laminated in this order, a configuration of "an ultra-thin copper layer/an intermediate layer/a carrier/a resin or prepreg/a carrier/an intermediate layer/an ultra-thin copper layer" laminated in this order, a configuration of "an ultra-thin copper layer/an intermediate layer/a carrier/a resin or prepreg/a resin or prepreg/a carrier/an intermediate layer/ an ultra-thin copper layer" laminated in this order, and a configuration of "a carrier/an intermediate layer/an ultra-thin copper layer/a resin or prepreg/an ultra-thin copper layer/an intermediate layer/a carrier" laminated in this order. The resin or prepreg may be a resin layer as mentioned hereinafter, and may contain any of a resin, a resin curing agent, a compound, a curing accelerator, a dielectric substance, a reaction catalyst, a crosslinking agent, a polymer, a prepreg and a skeletal material that are used for a resin layer as mentioned hereinafter. Note that the carrier-attached copper foil may be smaller than the resin or prepreg as viewed planarly.

<Ten Point Average Roughness Rz of Surface on Ultra-Thin Copper Layer Side>

The carrier-attached copper foil of the present invention is controlled so that the ten point average roughness Rz (JIS B0601-1994) of a surface on the ultra-thin copper layer side is 0.1 µm or more and 2.0 µm or less. Such a configuration improves uniformity at the time of chemical etching of the surface on the ultra-thin copper layer side and provides favorable circuit formability. When the ten point average roughness Rz of a surface on the ultra-thin copper layer side is less than 0.1 µm, adhesion with a resin such as a dry film would be degraded. When the ten point average roughness Rz of a surface on the ultra-thin copper layer side is greater than 2.0 µm, chemical etching uniformity would be degraded. The ten point average roughness Rz of a surface on the ultra-thin copper layer side is preferably 0.11 µm or more and 1.9 µm or less, is more preferably 0.12 µm or more and 1.8 µm or less, is furthermore preferably 0.13 µm or more and 1.7 µm or less, and is furthermore preferably 0.15 µm or more and 1.6 µm or less.

In an aspect of the present invention, the number of crystal grains per unit cross-sectional area of the ultra-thin copper layer in the through-thickness direction is controlled to be 0.1 to 5 grains/µm$^2$. Such a composition improves uniformity at the time of chemical etching of the surface on the ultra-thin copper layer side and provides favorable circuit formability. When the number of crystal grains per unit cross-sectional area of the ultra-thin copper layer in the through-thickness direction is less than 0.1 grain/µm$^2$, the grain boundaries are extremely reduced. The ultra-thin copper layer is insusceptible to chemical etching, causing a slowdown in the speed of chemical etching of the ultra-thin copper layer and decrease in productivity. When the number of crystal grains per unit cross-sectional area of the ultra-thin copper layer in the through-thickness direction is more than 5 grains/µm$^2$, because some portions that have many grain boundaries are locally created, such portions of the ultra-thin copper layer may be locally susceptible to chemical etching and other portions may be locally insusceptible to chemical etching. This may results in degradation in uniformity of chemical etching. The number of crystal grains per unit cross-sectional area of the ultra-thin copper layer in the through-thickness direction is preferably 0.2 grain/µm$^2$ or more and 4.8 grains/µm$^2$ or less, more preferably 0.3 grain/µm$^2$ or more and 4.5 grains/µm$^2$ or less, further more preferably 0.4 grain/µm$^2$ or more and 4.0 grains/µm$^2$ or less, furthermore preferably 0.4 grain/µm$^2$ or more and 3.8 grains/µm$^2$ or less, furthermore preferably 0.5 grain/µm$^2$ or more and 3.5 grains/µm$^2$ or less, and furthermore preferably 0.5 grain/µm$^2$ or more and 3.0 grains/µm$^2$ or less, and preferably 1.15 grains/µm$^2$ or less.

<An Average Grain Size of Crystal Grains that Form the Ultra-Thin Copper Layer in a Cross Section Taken in a Direction Parallel to a Through-Thickness Direction of the Ultra-Thin Copper Layer>

In another aspect of the present invention, the average grain size of crystal grains that form an ultra-thin copper layer in a cross section taken in a direction parallel to a through-thickness direction of the ultra-thin copper layer is preferably controlled to be 0.5 µm or more and 6.0 µm or less. Such a composition improves uniformity at the time of chemical etching of the surface on the ultra-thin copper layer side and provides favorable circuit formability. When the average grain size of crystal grains that form an ultra-thin copper layer in a cross section taken in a direction parallel to a through-thickness direction of the ultra-thin copper layer is less than 0.5 µm, because of many grain boundaries in an ultra-thin copper layer, some portions of the ultra-thin copper layer may be locally susceptible to chemical etching and other portions may be locally insusceptible to chemical etching. This may results in uniformity of chemical etching. When the average grain size of crystal grains that form an ultra-thin copper layer in a cross section taken in a direction parallel to a through-thickness direction of the ultra-thin copper layer exceeds 6.0 µm, the grain boundaries are extremely reduced. The entire ultra-thin copper layer is insusceptible to chemical etching, causing a slowdown in the speed of chemical etching of the ultra-thin copper layer and decrease in productivity. The average grain size of crystal grains that form the ultra-thin copper layer in a cross section taken in a direction parallel to a through-thickness direction of the ultra-thin copper layer is preferably 0.6 µm or more and 5.8 µm or less, more preferably 0.7 µm or more and 5.6 µm or less, furthermore preferably 0.8 µm or more and 5.6 µm or less, furthermore preferably 1.0 µm or more and 5.6 µm or less, and furthermore preferably 1.0 µm or more and 5.3 µm or less.

The number of crystal grains per unit cross-sectional area of the ultra-thin copper layer in the through-thickness direction, the average grain size of crystal grains that form the ultra-thin copper layer in a cross section taken in a direction parallel to a through-thickness direction of the ultra-thin copper layer, and the ten point average roughness Rz of the ultra-thin copper layer of the present invention can be controlled by forming an intermediate layer on a carrier and afterward forming an ultra-thin copper layer on a surface of the intermediate layer side of the carrier under the following plating conditions using a plating solution with the following composition as described below.

(Composition of Plating Solution for Forming Ultra-Thin Copper Layer)

copper concentration: 110 to 150 g/L

When the copper concentration of the plating solution is less than 110 g/L, supply of copper ion concentration may be reduced, and the growth speed of crystal grains may slow down. As a result, the number of crystal grains may become too large or the grain size may become too small. When the copper concentration of the plating solution exceeds 150 g/L, copper sulfate crystals are attached to the copper foil surface, which may result in stains or damages on the surface.

sulfuric acid concentration: 50-70 g/L

When the sulfuric acid concentration of the plating solution exceeds 70 g/L, the viscosity of electrolyte becomes high, the mass transfer rate of copper ions declines, and copper ions are less easily precipitated. This may result in formation of many small crystal grains and increase in the number of crystal grains.

chlorine concentration (may not be added): 60-120 mass ppm glue concentration (may not be added): 5-12 mass ppm when added with chlorine or 1-2 mass ppm in the absence of chlorine bis(3-sulfopropyl)-disulfide (SPS, may not be added): 50-100 mass ppm amine compound (may not be added): 50-100 mass ppm In the amine compound provided in the following formula (1), $R_1$ and $R_2$ each are selected from the group consisting of a hydroxyalkyl group, an ether group, an aromatic group, an aromatic-substituted alkyl group, an unsaturated hydrocarbon group and an alkyl group.

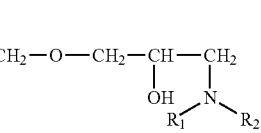

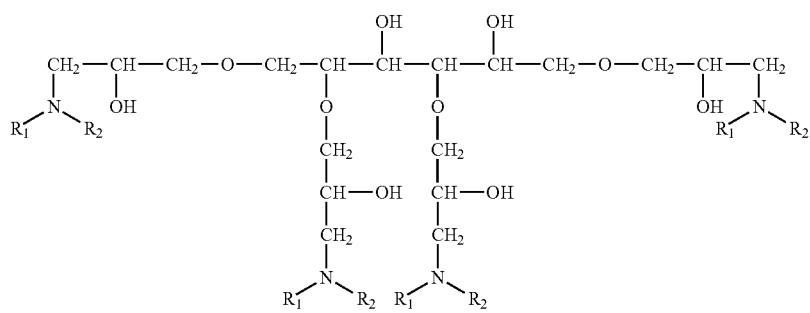

(1)

(Plating Condition for Formation of Ultra-thin Copper Layer)

electrolyte temperature: 65-90° C.
current density: 25-70 A/dm$^2$
electrolyte linear flow rate: 3.5-8.0 m/sec <Roughening Treatment and Other Surface Treatment>

A roughened layer may be provided to a surface of the ultra-thin copper layer by applying a roughening treatment to the surface in order to improve adhesion to, for example, an insulating substrate. The roughening treatment can be applied, for example, by forming roughening particles of copper or a copper alloy. The roughening particles may be small. The roughening treatment may be a fine treatment. The roughened layer may be a layer formed of an element selected from the group consisting of copper, nickel, phosphorus, tungsten, arsenic, molybdenum, chromium, titanium, iron, vanadium, cobalt, and zinc or an alloy containing at least one of these. Alternatively, a roughening treatment in which after forming roughening particles of copper or a copper alloy, secondary particles or tertiary particles formed of an element of nickel, cobalt, copper or zinc or of an alloy of these are provided can be carried out. Thereafter, a heat-resistant layer or a rustproofing layer may be formed of an element of nickel, cobalt, copper, zinc, tin, molybdenum, tungsten, phosphorus, arsenic, chromium, vanadium, titanium, aluminum, gold, silver, platinoid elements, iron, tantalum and/or an alloy of these and/or a nitride of these and/or an oxide of these and/or a silicide of these. Furthermore, the surface thereof may be treated by a treatment such as a chromate treatment and/or a silane coupling treatment. Alternatively, without the roughening treatment, a heat-resistant layer or a rustproofing layer is formed of an element of nickel, cobalt, copper, zinc, tin, molybdenum, tungsten, phosphorus, arsenic, chromium, vanadium, titanium, aluminum, gold, silver, platinoid elements, iron, tantalum and/or an alloy of these and/or a nitride of these and/or an oxide of these and/or a silicide of these and the resultant surface may be treated by a treatment such as a chromate treatment and/or a silane coupling treatment. In other words, at least one layer selected from the group consisting of a heat-resistant layer, a rustproofing layer, a chromate treated layer and a silane coupling-treated layer may be formed on a surface of the roughened layer; or at least one layer selected from the group consisting of a heat-resistant layer, a rustproofing layer, a chromate treated layer and a silane coupling-treated layer may be formed on a surface of the ultra-thin copper layer. Note that the aforementioned heat-resistant layer, rustproofing layer, chromate treated layer and silane coupling-treated layer are each formed of a plurality of layers (for example, two layers or more, three layers or more). Note that the surface treatments other than roughening treatment have little effect on the surface roughness of the ultra-thin copper layer.

For example, as the roughening treatment, copper-cobalt-nickel alloy plating is carried out so that a ternary alloy layer is formed by electroplating with the deposition amount of 15-40 mg/dm$^2$ copper, 100-3000 μg/dm$^2$ cobalt, and 100-1500 μg/dm$^2$ nickel. When the deposition amount of Co is less than 100 μg/dm$^2$, heat resistance is degraded, and etching performance may be deteriorated. When the deposition amount of Co exceeds 3000 μg/dm$^2$, the roughening treatment is not favorable in a case in which a magnetic influence needs to be considered, etching stains may be caused, and acid resistivity and chemical resistance may be degraded. When the deposition amount of Ni is less than 100 μg/dm$^2$, heat resistance may be degraded. On the other hand, when the deposition amount of Ni exceeds 1500 μg/dm$^2$, etching residues may be increased. The preferable deposition amount of Co is 1000-2500 μg/dm$^2$, and the preferable deposition amount of nickel is 500-1200 μg/dm$^2$. Here, the etching stain refers to Co that remains undissolved when the etching is performed with copper chloride, and the etching residue refers to Ni that remains undissolved when the alkali etching is performed with ammonium chloride.

An example of typical bath and plating conditions for such ternary alloy plating, or copper-cobalt-nickel alloy plating, are provided below:

Plating bath composition: Cu 10-20 g/L, Co 1-10 g/L, Ni 1-10 g/L
pH: 1-4
Temperature: 30-50° C.
Current density $D_k$: 20-30 A/dm$^2$
Plating time: 1-5 seconds The aforementioned chromate treated layer refers to a layer treated with a liquid including chromic acid anhydride, chromic acid, dichromic acid, chromate, or dichromate. The chromate treated layer may contain an element (in any form such as metal, alloy, oxide, nitride, and sulfide) of Co, Fe, Ni, Mo, Zn, Ta, Cu, Al, P, W, Sn, As and Ti etc. Specific examples of the chromate treated layer include a chromate treated layer which is treated with chromic acid anhydride or potassium dichromate aqueous solution and a chromate treated layer treated with a treatment liquid containing zinc and chromic acid anhydride or potassium dichromate.

The aforementioned silane coupling-treated layer may be formed using a silane coupling agent known in the art, or may be formed using a silane coupling agent including epoxy silanes, amino silanes methacryloxy silanes, mercapto silanes, vinyl silanes, imidazole silanes, triazine silanes and the like. Note that for such a silane coupling agent, two or more kinds of agents may be mixed for use. In particular, an agent that is made by using an amino silane coupling agent or an epoxy silane coupling agent is preferable.

A surface treatment described in International Publication No. WO2008/053878, Japanese Patent Laid-Open Application No. 2008-111169, Japanese Patent No. 5024930, International Publication No. WO2006/028207, Japanese Patent No. 4828427, International Publication No. WO2006/134868, Japanese Patent No. 5046927, International Publication No. WO2007/105635, Japanese Patent No. 5180815, and Japanese Patent Laid-Open Application No. 2013-19056 can be applied to a surface of the ultra-thin copper layer, the roughened layer, the heat-resistant layer, the rustproofing layer, the silane coupling-treated layer or the chromate treated layer.

In addition, the carrier-attached copper foil that has a carrier, an intermediate layer laminated on the carrier, and an ultra-thin copper layer laminated on the intermediate layer may also have a roughened layer on the ultra-thin copper layer, and may include at least one layer selected from the group consisting of a heat-resistant layer, a rustproofing layer, a chromate treated layer and a silane coupling-treated layer on the roughened layer.

The carrier-attached copper foil may include a roughened layer on the ultra-thin copper layer; a heat-resistant layer or a rustproofing layer on the roughened layer, a chromate treated layer on the heat-resistant layer or the rustproofing layer; and a silane coupling-treated layer on the chromate treated layer.

The carrier-attached copper foil may also include a resin layer on the ultra-thin copper layer, on the roughened layer, or on the heat-resistant layer, the rustproofing layer, the chromate treated layer or the silane coupling-treated layer. The resin layer may be an insulating resin layer.

The resin layer may be an adhesive layer and may be an insulating resin layer in a semi-cured state (B-stage), serving as an adhesive. The semi-cured state (B-stage) include a state where the surface thereof is not sticky if touched by a finger; the insulating resin layers of this state can be laminated and stored; and a curing reaction proceeds if a heating treatment is further applied.

The resin layer may contain a thermosetting resin or may be formed of a thermoplastic resin. The resin layer may contain a thermoplastic resin. The type of resin forming the resin layer is not particularly limited but preferably includes a resin containing at least one selected from the group consisting of an epoxy resin, a polyimide resin, a polyfunctional cyanate compound, a maleimide compound, a polyvinyl acetal resin, a urethane resin, polyether sulfone, a polyether sulfone resin, an aromatic polyamide resin, an aromatic polyamide resin polymer, a rubber resin, a polyamine, an aromatic polyamine, a polyamide-imide resin, a rubber modified epoxy resin, a phenoxy resin, a carboxyl group-modified acrylonitrile-butadiene resin, a polyphenylene oxide, a bismaleimide triazine resin, a thermosetting polyphenylene oxide resin, a cyanate resin, an anhydride of a carboxylic acid, an anhydride of a polybasic carboxylic acid, a linear polymer having a crosslinkable functional group, a polyphenylene ether resin, 2,2-bis(4-cyanatophenyl)propane, a phosphorus-containing phenol compound, manganese naphthenate, 2,2-bis(4-glycidylphenyl)propane, a polyphenylene ether-cyanate resin, a siloxane-modified polyamide-imide resin, a cyano ester resin, a phosphazene resin, a rubber-modified polyamide-imide resin, isoprene, a hydrogenated polybutadiene, polyvinyl butyral, phenoxy, a polymer epoxy, an aromatic polyamide, a fluorine resin, a bisphenol, a polyimide block copolymer resin and a cyano ester resin.

The epoxy resin has two or more epoxy groups in a molecule. Any epoxy resin can be used without problems as long as it can be used as an electrical/electron material. An epoxy resin obtained by epoxylating a compound having two or more glycidyl groups in a molecule is preferable. As the epoxy resin, a single resin selected from the group consisting of a bisphenol A type epoxy resin, a bisphenol F type epoxy resin, a bisphenol S type epoxy resin, a bisphenol AD type epoxy resin, a Novolak type epoxy resin, a cresol Novolak type epoxy resin, an alicyclic epoxy resin, a brominated epoxy resin, a phenol Novolak type epoxy resin, a naphthalene type epoxy resins, a brominated bisphenol A type epoxy resin, an o-cresol Novolak type epoxy resin, a rubber-modified bisphenol A type epoxy resin, a glycidyl amine type epoxy resin, triglycidyl isocyanurate, a glycidyl amine compound such as a N,N-diglycidylaniline, glycidyl ester compound such as diglycidyl tetrahydrophthalate, a phosphorus-containing epoxy resin, a biphenyl type epoxy resin, a biphenyl Novolak type epoxy resin, a trishydroxyphenylmethane type epoxy resin and a tetraphenyl ethane epoxy resin, may be used, or two or more resins selected from the aforementioned group are used as a mixture. Alternatively, these epoxy resins can be hydrogenated or halogenated and put in use.

As the phosphorus-containing epoxy resin, a phosphorus-containing epoxy resin known in the art can be used. The phosphorus-containing epoxy resin is preferably an epoxy resin derived from, a compound having two or more epoxy groups in a molecule such as 9,10-dihydro-9-oxa-10-phospha-phenanthrene-10-oxide.

The resin layer may contain a resin known in the art, a resin curing agent, a compound, a curing accelerator, a dielectric substance (any dielectric substance may be used such as a dielectric substance containing an inorganic compound and/or an organic compound and a dielectric substance containing a metal oxide), a reaction catalyst, a crosslinking agent, a polymer, a prepreg and a skeletal material. Furthermore, the resin layer may be formed by using the substances (such as resins, resin curing agents, compounds, curing accelerator, a dielectric substance, reaction catalyst, crosslinking agent, a polymer, a prepreg and a skeletal material) and/or a method for forming a resin layer and/or a forming apparatus that are described, for example, in International Publication No. WO2008/004399, International Publication No. WO2008/053878, International Publication No. WO2009/084533, Japanese Patent Laid-Open Application No. 11-5828, Japanese Patent Laid-Open Application No. 11-140281, Japanese Patent No. 3184485, International Publication No. WO97/02728, Japanese Patent No. 3676375, Japanese Patent Laid-Open Application No. 2000-43188, Japanese Patent No. 3612594, Japanese Patent Laid-Open Application No. 2002-179772, Japanese Patent Laid- Open Application No. 2002-359444, Japanese Patent Laid-Open Application No. 2003-304068, Japanese Patent No. 3992225, Japanese Patent Laid-Open Application No. 2003-249739, Japanese Patent No. 4136509, Japanese Patent Laid-Open Application No. 2004-82687, Japanese Patent No. 4025177, Japanese Patent Laid-Open Application No. 2004-349654, Japanese Patent No. 4286060, Japanese Patent Laid-Open Application No. 2005-262506, Japanese Patent No. 4570070, Japanese Patent Laid-Open Application No. 2005-53218, Japanese Patent No. 3949676, Japanese Patent No. 4178415, International Publication No. WO2004/005588, Japanese Patent Laid-Open Application No. 2006-257153, Japanese Patent Laid-Open Application No. 2007-326923, Japanese Patent Laid-Open Application No. 2008-111169, Japanese Patent No. 5024930, International Publication No. WO2006/028207, Japanese Patent No. 4828427, Japanese Patent Laid-Open Application No. 2009-67029, International Publication No. WO2006/134868, Japanese Patent No. 5046927, Japanese Patent Laid-Open Application No. 2009-173017, International Publication No. WO2007/105635, Japanese Patent No. 5180815, International Publication No. WO2008/114858, International Publication No. WO2009/008471, Japanese Patent Laid-Open Application No. 2011-14727, International Publication No. WO2009/001850, International Publication No. WO2009/145179, International Publication No. WO2011/068157 and Japanese Patent Laid-Open Application No. 2013-19056.

The aforementioned resins are dissolved in a solvent such as methyl ethyl ketone (MEK) and toluene to obtain a resin liquid, and the resin liquid is applied on the ultra-thin copper layer, or on the heat-resistant layer, the rustproofing layer, the chromate treated layer, or the silane coupling treated layer in accordance with a roll coater method as an example and, if necessary, is dried by heating to remove the solvent to obtain B-stage of the resin. In the drying operation, for example a hot-air drying furnace may be used. The drying temperature may be 100 to 250° C. and preferably 130 to 200° C.

The carrier-attached copper foil having the resin layer (resin-attached and carrier-attached copper foil) is used in the following manner. After the resin layer is laminated on a substrate, the entire construct is subjected to thermocompression to cure the resin layer. The carrier is detached to expose the ultra-thin copper layer (naturally, the surface of the ultra-thin copper layer on the side near the intermediate layer is exposed), and a predetermined wiring pattern is formed thereon.

If the resin-attached carrier-attached copper foil is used, the number of prepreg material used during manufacturing of a multilayer printed wiring board can be reduced. In addition, the thickness of the resin layer is controlled such that interlayer insulation can be ensured and a copper-clad laminate can be produced even if a prepreg material is not used at all. At this time, if the surface of the substrate is undercoated with an insulating resin, smoothness of the surface can be further improved.

Note that the case where a prepreg material is not used is economically advantageous because the cost for a prepreg material can be saved and the laminating step is simplified. In addition, the thickness of the resultant multilayer printed circuit board can be reduced as much as the thickness of the prepreg material. As a result, an ultra-thin multilayer printed wiring board with a thickness of a single layer being 100 μm or less is advantageously produced.

The thickness of the resin layer is preferably 0.1 to 80 μm. If the thickness of the resin layer is lower than 0.1 μm, adhesive force reduces. If such a resin-attached carrier-attached copper foil is laminated on a substrate having an interlayer material without interposing a prepreg material, it is sometimes difficult to ensure interlayer insulation with the circuit of the interlayer material.

In contrast, if the thickness of the resin layer is greater than 80 μm, it becomes difficult to form a resin layer having a desired thickness in a single coating step and economically disadvantageous because an extra material cost and an extra number of steps are required. Moreover, cracks are readily formed during handling because the thickly formed resin layer is less flexible, and smooth lamination may be difficult because excessive resin flow may be caused at the time of thermocompression with the interlayer material.

Furthermore, another product form of the resin-attached carrier-attached copper foil can also be produced as follows. The ultra-thin copper layer, or the heat-resistant layer, rustproofing layer, or the chromate treated layer, or the silane coupling-treated layer is covered with a resin layer, the resin layer is made in a semi-cured state, and then the carrier is detached to obtain a resin-attached copper foil without a carrier.

Moreover, a printed wiring board is completed by mounting electronic components etc. on the printed wiring board. In the present invention, "printed wiring board" includes such a printed wiring board, a printed circuit board, and a printed substrate that have electronic components etc. mounted.

In addition, an electronic device may be produced by using this printed wiring board, an electronic device may be produced by using such a printed circuit board that has the electronic components etc. mounted, and an electronic device may be produced by using such a printed substrate that has electronic components etc. mounted. Some examples of manufacturing processes of a printed wiring board by using the carrier-attached copper foil according to the present invention are provided hereinafter.

In an embodiment of the method of manufacturing a printed wiring board according to the present invention, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated such that an ultra-thin copper layer faces the insulating substrate), to form a copper-clad laminate, and thereafter a step of forming a circuit by any one of a semi-additive method, a modified semi-additive method, a partly additive method and a subtractive method. The insulating substrate may have an inner layer circuit.

In the present invention, the semi-additive method refers to a method of forming a conductive pattern by applying non-electrolytic plating onto an insulating substrate or a copper foil seed layer to form a thin plating layer, forming a pattern, and thereafter applying electroplating and etching.

Accordingly, in the embodiment of the method of manufacturing a printed wiring board according to the present invention using the semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of completely removing an ultra-thin copper layer exposed by detaching the carrier by e.g., an etching method using a corrosive solution such as an acid, or a plasma method, a step of forming through-holes or/and blind vias in the resin exposed by removing the ultra-thin copper layer by etching, a step of applying a desmear treatment to a region containing the through-holes or/and blind vias, a step of providing an non-electrolytic plating layer on the region containing the resin, the through-holes or/and blind vias, a step of forming a plating resist on the non-electrolytic plating layer, a step of applying light to the plating resist to remove the plating resist of a region in which the circuit is to be formed, a step of forming an electrolytic plating layer on the region in which the circuit is to be formed and the plating resist has been removed a step of removing the plating resist; and a step of removing the non-electrolytic plating layer present in the region except the region in which the circuit is to be formed, by e.g., flash etching.

In another embodiment of the method of manufacturing a printed wiring board according to the present invention using the semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in a ultra-thin copper layer exposed by detaching the carrier and the insulating resin substrate, a step of applying a desmear treatment to a region containing the through-holes or/and blind vias, a step of completely removing an ultra-thin copper layer exposed by detaching the carrier by an etching method using a corrosive solution such as an acid, or a plasma method;

a step of forming a non-electrolytic plating layer on the resin exposed by removing the ultra-thin copper layer by etching and the region containing the through-holes or/and blind vias, a step of forming a plating resist on the non-electrolytic plating layer, a step of applying light to the plating resist, and thereafter removing the plating resist of a region in which the circuit is to be formed, a step of forming an electrolytic plating layer on the region in which the circuit is to be formed and the plating resist has been removed;

a step of removing the plating resist; and a step of removing the non-electrolytic plating layer present in the region except the region in which the circuit is to be formed, by e.g., flash etching.

In another embodiment of the method of manufacturing a printed wiring board according to the present invention using the semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in a ultra-thin copper layer exposed by detaching the carrier and the insulating resin substrate, a step of completely removing an ultra-thin copper layer exposed by detaching the carrier by an etching method using a corrosive solution such as an acid, or a plasma method;

a step of applying a desmear treatment to a region containing the through-holes or/and blind vias, a step of forming a non-electrolytic plating layer on the resin exposed by removing the ultra-thin copper layer by etching and the region containing the through-holes or/and blind vias, a step of forming a plating resist on the non-electrolytic plating layer, a step of applying light to the plating resist, and thereafter removing the plating resist of a region in which the circuit is to be formed, a step of forming an electrolytic plating layer on the region in which the circuit is to be formed and the plating resist has been removed;

a step of removing the plating resist; and a step of removing the non-electrolytic plating layer present in the region except the region in which the circuit is to be formed, by e.g., flash etching.

In another embodiment of the method of manufacturing a printed wiring board according to the present invention using the semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated); a step of completely removing an ultra-thin copper layer exposed by detaching the carrier by an etching method using a corrosive solution such as an acid, or a plasma method;

a step of forming a non-electrolytic plating layer on the surface of the resin exposed by removing the ultra-thin copper layer by etching, a step of forming a plating resist on the non-electrolytic plating layer, a step of applying light to the plating resist, and thereafter removing the plating resist of a region in which the circuit is to be formed, a step of forming an electrolytic plating layer on the region in which the circuit is to be formed and the plating resist has been removed;

a step of removing the plating resist; and a step of removing the non-electrolytic plating layer and the ultra-thin copper layer present in the region except the region in which the circuit is to be formed, by e.g., flash etching.

In the present invention, the modified semi-additive method refers to a method of forming a circuit on an insulating layer by laminating a metal foil on an insulating layer, protecting a non-circuit forming portion with a plating resist, thickening a circuit forming portion with copper by electrolytic plating, removing the resist and removing the metal foil of the region except the circuit forming portion by (flash) etching.

Accordingly, in the embodiment of the method of manufacturing a printed wiring board according to the present invention using the modified semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated); a step of forming through-holes or/and blind vias in the ultra-thin copper layer exposed by detaching the carrier and the insulating substrate, a step of applying a desmear treatment to a region containing the through-holes or/and blind vias, a step of providing an non-electrolytic plating layer on the region containing the through-holes or/and blind vias, a step of forming a plating resist on the surface of the ultra-thin copper layer exposed by detaching the carrier, a step of forming a circuit by electro plating (after the plating resist is formed), a step of removing the plating resist; and a step of removing the ultra-thin copper layer exposed by removing the plating resist, by flash etching.

In another embodiment of the method of manufacturing a printed wiring board according to the present invention using the modified semi-additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming a plating resist on the ultra-thin copper layer exposed by detaching the carrier, a step of applying light to the plating resist to remove the plating resist in the region in which a circuit is to be formed, a step of forming an electrolytic plating layer on the region in which the circuit is to be formed and the plating resist has been removed, a step of removing the plating resist; and a step of removing the non-electrolytic plating layer and the ultra-thin copper layer in the region except the region in which the circuit is to be formed, by e.g., flash etching.

In the present invention, the partly additive method refers to a method of manufacturing a printed-wiring board, which includes providing a catalyst nucleus on a substrate having a conductor layer and, if necessary, having holes for through-holes and via holes, forming a conductor circuit by etching, providing a solder resist or a plating resist, as needed, and thickening the conductor circuit, e.g., through-hole and via holes, by non-electrolytic plating.

Accordingly, in the embodiment of the method of manufacturing a printed wiring board according to the present invention using the partly additive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and the insulating substrate, a step of applying a desmear treatment to the region containing the through-hole or/and blind vias, a step of providing a catalyst nucleus to the region containing the through-hole or/and blind vias, a step of providing an etching resist to the ultra-thin copper layer surface exposed by detaching the carrier, a step of forming a circuit pattern by applying light to the etching resist, a step of forming a circuit by removing the ultra-thin copper layer and the catalyst nucleus by e.g., an etching method using a corrosive solution such as an acid, or a plasma method, a step of removing the etching resist, a step of forming a solder resist or a plating resist on the surface of the insulating substrate exposed by removing the ultra-thin copper layer and the catalyst nucleus by e.g., an etching method using a corrosive solution such as an acid, or a plasma method; and a step of providing a non-electrolytic plating layer in the region in which neither the solder resist nor plating resist is provided.

In the present invention, the subtractive method refers to a method of forming a conductive pattern by selectively removing an unwanted part in the copper foil on a copper-clad laminate by e.g., etching.

Accordingly, in the embodiment of the method of manufacturing a printed wiring board according to the present invention using the subtractive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and insulating substrate, a step of applying a desmear treatment to the region containing the through-hole or/and blind vias, a step of providing an non-electrolytic plating layer in the region containing the through-hole or/and blind vias, a step of providing an electrolytic plating layer on the surface of the non-electrolytic plating layer, a step of providing an etching resist on the surface of the electrolytic plating layer or/and the ultra-thin copper layer, a step of forming a circuit pattern by applying light to the etching resist, a step of forming a circuit by removing the ultra-thin copper layer, non-electrolytic plating layer and electrolytic plating layer by e.g., an etching method using a corrosive solution such as an acid, or a plasma method; and a step of removing the etching resist.

In another embodiment of the method of manufacturing a printed wiring board according to the present invention using the subtractive method, the method of the invention includes a step of preparing a carrier-attached copper foil according to the present invention and an insulating substrate, a step of laminating the carrier-attached copper foil and the insulating substrate, a step of detaching the carrier from the carrier-attached copper foil (after the carrier-attached copper foil and the insulating substrate are laminated), a step of forming through-holes or/and blind vias in the ultra-thin copper layer exposed by detaching the carrier and insulating substrate a step of applying a desmear treatment to the region containing the through-hole or/and blind vias, a step of providing an non-electrolytic plating layer on the region containing the through-hole or/and blind vias, a step of forming a mask on the surface of the non-electrolytic plating layer, a step of forming an electrolytic plating layer on the surface of the non-electrolytic plating layer in which no mask is formed, a step of forming an etching resist on the surface of the electrolytic plating layer or/and the ultra-thin copper layer, a step of forming a circuit pattern by applying light to the etching resist, a step of forming a circuit by removing the ultra-thin copper layer and the non-electrolytic plating layer by e.g., an etching method using a corrosive solution such as an acid, or a plasma method; and a step of removing the etching resist.

The step of forming through-holes or/and blind vias and the following desmear step may not be performed.

Now, the method of manufacturing a printed wiring board using the carrier-attached copper foil of the invention will be more specifically described below, with reference to figures. Note that although an example of the method of manufacturing using a carrier-attached copper foil that has an ultra-thin copper layer on which a roughened layer is formed is provided hereafter, the method of manufacturing is not limited to this method. The following method of manufacturing a printed wiring board can also be performed in the similar manner by using a carrier-attached copper foil having an ultra-thin copper layer on which a roughened layer is not formed.

First, as shown in FIG. 1-A, a carrier-attached copper foil (first layer) having an ultra-thin copper layer having a roughened layer formed on the surface is prepared.

Next, as shown in FIG. 1-B, a resist is applied onto the roughened layer on the ultra-thin copper layer and subjected to a light exposure and development operation to etch the resist into a predetermined shape.

Next, as shown in FIG. 1-C, plating for a circuit is formed and thereafter the resist is removed to form a circuit plating having a predetermined shape.

Figure 2:
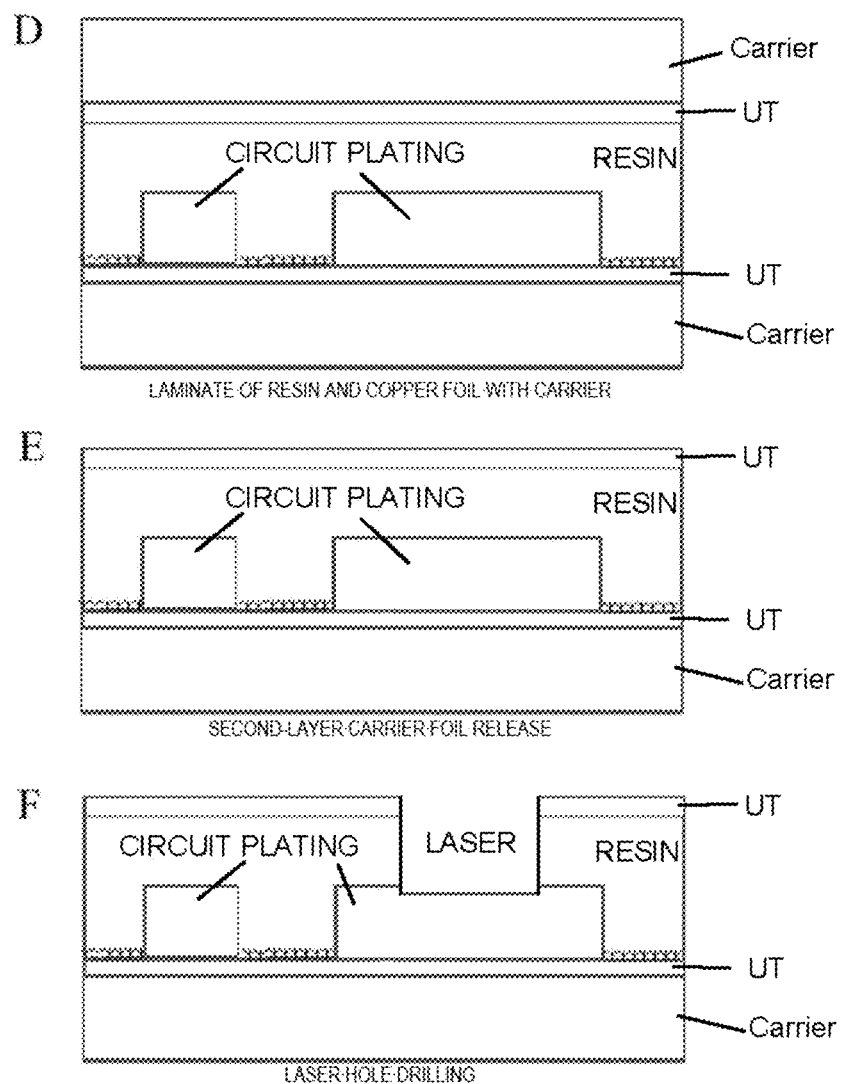
FIG. 2D-F is a schematic cross-sectional view of the wiring board at the steps from the lamination of the resin and the carrier-attached copper foil on the second layer to laser drilling according to a specific example of the method for manufacturing a printed wiring board using the carrier-attached copper foil of the invention.

Next, as shown in FIG. 2-D, an embedding resin is provided on the ultra-thin copper layer so as to cover the circuit plating (so as to bury the circuit plating) and subsequently another carrier-attached copper foil (second layer) is bonded from the side of the ultra-thin copper layer.

Next, as shown in FIG. 2-E, carrier is removed from the second layer carrier-attached copper foil.

Next, as shown in FIG. 2-F, holes are formed by applying laser at the predetermined positions of the resin layer and the circuit plating is exposed to light to form blind vias.

Figure 3:
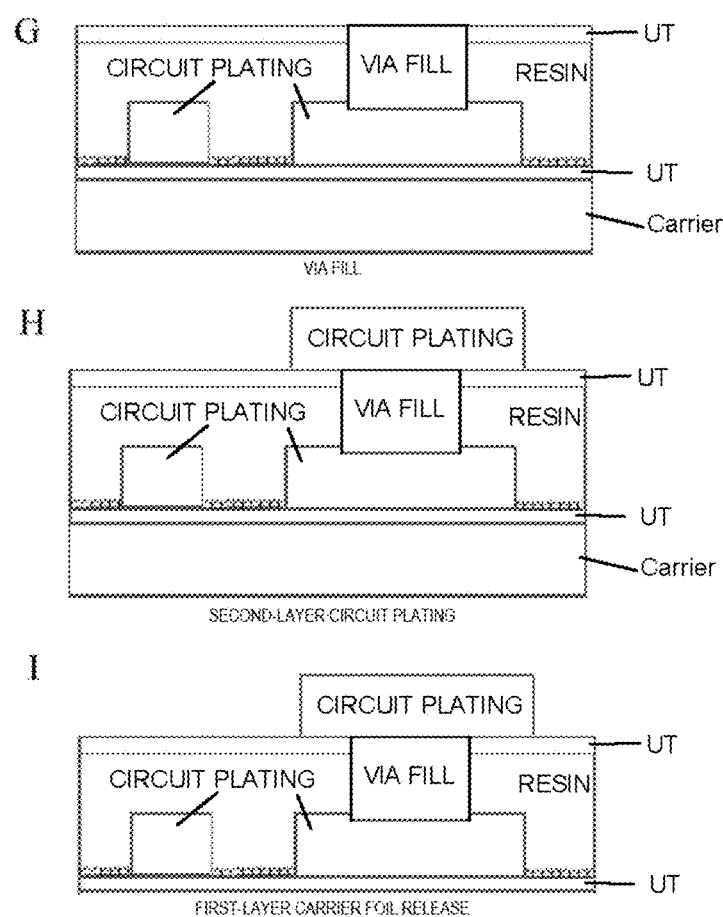
FIG. 3G-I is a schematic cross-sectional view of the wiring board at the steps from via fill formation to the removal of the carrier on the first layer according to a specific example of the method for manufacturing a printed wiring board using the carrier-attached copper foil of the invention.

Next, as shown in FIG. 3-G, blind vias are embedded with copper to form via fill.

Next, as shown in FIG. 3-H, circuit plating is formed on the via fill, as FIG. 1-B and FIG. 1-C described above.

Next, as shown in FIG. 3-I, the carrier is removed from the firth carrier-attached copper foil.

Figure 4:
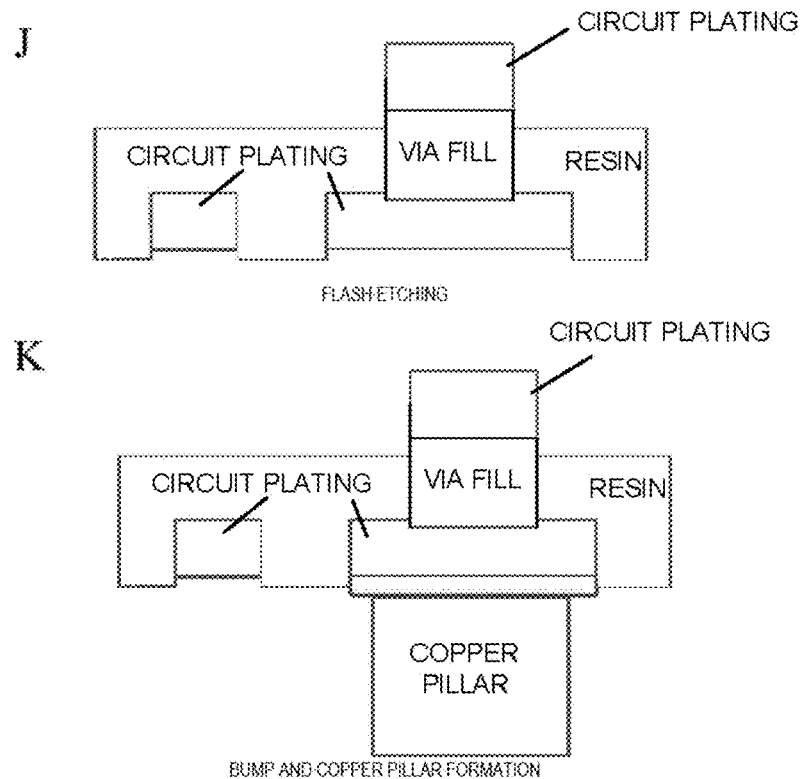
FIG. 4J-K is a schematic cross-sectional view of the wiring board at the steps from flash etching to formation of a bump and a copper pillar according to a specific example of the method for manufacturing a printed wiring board using the carrier-attached copper foil of the invention.

Next, as shown in FIG. 4-J, the ultra-thin copper layer of both surfaces are removed by flash etching to expose the surface of the circuit plating within the resin layer.

Next, as shown in FIG. 4-K, bumps are formed on the circuit plating within the resin layer and a copper pillar is formed on the solder. In this manner, a printed-wiring board using the carrier-attached copper foil of the invention is prepared.

Note that in the above descriptions of the method of manufacturing a printed wiring board, it is also possible to replace "ultra-thin copper layer" with "carrier" and to replace "carrier" with "ultra-thin copper layer". In this manner, manufacture of a printed wiring board can be performed by forming a circuit on the surface of the carrier-attached copper foil on the carrier side and embedding the circuit in the resin.

As the above another carrier-attached copper foil (second layer), the carrier-attached copper foil of the invention, a conventional carrier-attached copper foil or a general copper foil may be used. On the circuit on the second layer shown in FIG. 3-H, a single-layer circuit or plural-layer circuits may be formed. These circuits may be formed by any one of a semi-additive method, a subtractive method, a partly additive step and a modified semi-additive method.

According to the method of manufacturing the printed wiring board as described above, the circuit plating is configured to be embedded in the resin layer. Thus, when removing the ultra-thin copper layer by flash etching as illustrated in FIG. 4-J, for example, the circuit plating is protected by the resin layer, maintaining its geometry, thereby making it easy to form a fine circuit. Also, since the circuit plating is protected by the resin layer, migration resistance improves, and the electric connection between circuit wirings can be satisfactory suppressed. Thus, it becomes easy to form a fine circuit. As illustrated in FIGS. 4-J and 4-K, when the ultra-thin copper layer has been removed by flash etching, the exposed surface of the circuit plating is recessed within the resin layer. Thus, it becomes easy to form a bump on the circuit plating, and a copper pillar thereon, increasing the manufacturing efficiency.

Note that as the embedding resin (resin), a resin known in the art and a prepreg can be used. For example, BT (bis-maleimide triazine) resin and a prepreg, which is glass cloth impregnated with a BT resin, ABF film and ABF manufactured by Ajinomoto Fine-Techno Co., Inc. can be used. As the embedding resin (resin), the resin layer and/or resin and/or prepreg described in the specification can be used.

Furthermore, the carrier-attached copper foil used as the first layer may have a substrate and a resin layer on a surface of the carrier-attached copper foil. The presence of the substrate or resin layer is advantageous since the carrier-attached copper foil used as the first layer is supported and wrinkle is rarely formed, with the result that productivity is improved. Note that as the substrate or the resin layer, any substrate may be used as long as it has an effect of supporting the carrier-attached copper foil used as the first layer. Example of the substrate or the resin layer that can be used herein include a carrier, a prepreg and a resin layer as described in the specification; a carrier, a prepreg, a resin layer, a metal plate, a metal foil, a plate of an inorganic compound, a foil of an inorganic compound, a board of an organic compound and a foil of an organic compound known in the art. In addition, a printed wiring board may also be manufactured by preparing a laminate having a configuration in which a substrate, a resin substrate, a resin, or a prepreg is placed at the center of the laminate, and on both surfaces of the substrate, the resin substrate, the resin, or the prepreg, carrier-attached copper foils are layered in the order of a carrier/an intermediate layer/an ultra-thin copper layer or in the order of an ultra-thin copper layer/an intermediate layer/a carrier, by using the carrier-attached copper foils of the laminate as a carrier-attached copper foil used for the first layer in FIG. 1-A and by forming a circuit on the surface of the carrier-attached copper foil on both sides of the laminate according to the method of manufacturing a printed wiring board as described above. Note that another layer or other layers may be placed between the resin substrate, the resin, or the prepreg and one or both carrier-attached copper foils. Note that in the present specification, the concept of "circuit" includes wiring.

In addition, the method of manufacturing a printed wiring board according to the present invention may be one of methods of manufacturing a printed wiring board (coreless technique) that includes a step of laminating the carrier-attached copper foil on a resin substrate so as to attach a surface on a side of the ultra-thin copper layer or a surface on a side of the carrier side of the carrier to the resin substrate, a step of providing two layers including a resin layer and a circuit at least once on a surface of the carrier-attached copper foil that is on the opposite side of the surface to which the resin substrate is laminated, and a step of detaching the carrier or the ultra-thin copper layer from the carrier-attached copper foil after forming the two layers including a resin layer and a circuit. Note that the two layers including a resin layer and a circuit may be provided in the order of a resin layer and a circuit or in the order of a circuit and a resin layer. A specific example of this coreless technique is such that a laminate (also referred to as a copper-clad laminate board or a copper-clad laminate) is manufactured, first, by attaching a resin substrate to a surface on the ultra-thin copper layer side or a surface on the carrier side of a carrier attached copper foil to laminate. Afterwards, a resin layer is formed on the surface of the carrier-attached copper foil that is on the opposite side of the surface to which the resin substrate is attached. A surface on an ultra-thin copper layer side or a surface on a carrier side of another carrier-attached copper foil may be further attached to the resin layer that is formed on the surface on the ultra-thin copper layer side or a surface on the carrier side. In addition, the above-described method of manufacturing a printed wiring board (coreless technique) may use a laminate having a configuration in which a resin substrate, a resin, or a prepreg is placed at the center of the laminate, and on both surfaces of the resin substrate, the resin, or the prepreg, carrier-attached copper foils are layered in the order of a carrier/an intermediate layer/an ultra-thin copper layer or in the order of an ultra-thin copper layer/an intermediate layer/a carrier. Another layer or other layers may be placed between the resin substrate, the resin, or the prepreg and one or both carrier-attached copper foils. Alternatively, a laminate having a configuration in which "a carrier/an intermediate layer/an ultra-thin copper layer/a resin substrate, a resin, or a prepreg/a carrier/an intermediate layer/an ultra-thin copper layer", a laminate having a configuration in which "a carrier/an intermediate layer/an ultra-thin copper layer/a resin substrate/a carrier/an intermediate layer/an ultra-thin copper layer", or a laminate having a configuration in which "an ultra-thin copper layer/an intermediate layer/a carrier/a resin substrate/a carrier/an intermediate layer/an ultra-thin copper layer" may be used in the method of manufacturing a printed wiring board (coreless technique) described above. Another resin layer may be provided on the exposed surface of the ultra-thin copper layer or the carrier that is the outermost layer of the laminate, and a copper layer or a metal layer may be further deposited over the resin layer so that a circuit or a wiring is formed by processing the copper layer or the metal layer. Furthermore, another resin layer may be provided on the circuit or the wiring so as to embed (bury) the circuit or the wiring in the resin layer. Alternatively, a copper or metal circuit or a copper or metal wiring may be provided on the exposed surface of the ultra-thin copper layer or the carrier that is the outermost layer of the laminate, and another resin layer may be provided on the wiring or the circuit so that the wiring or the circuit is embedded (buried) in the resin layer. Over this resin layer, a circuit or a wiring and a resin layer may be formed afterwards. This formation of a circuit or a wiring and a resin layer may be performed once or more than once (buildup technique). In the laminate formed in this manner (hereinafter also referred to as laminate B), the ultra-thin copper layer or the carrier of each carrier-attached copper foil can be detached from the carrier or the ultra-thin copper layer, respectively, so as to produce a coreless substrate. Note that in the above-described production of a coreless substrate, any of a laminate having a configuration of an ultra-thin copper layer/an intermediate layer/a carrier/a carrier/an intermediate layer/an ultra-thin copper layer, a laminate having a configuration of a carrier/an intermediate layer/an ultra-thin copper layer/an ultra-thin copper layer/an intermediate layer/a carrier, and a laminate having a configuration of a carrier/an intermediate layer/an ultra-thin copper layer/a carrier/an intermediate layer/an ultra-thin copper layer that are described later is produced by using two carrier-attached copper foils, and the produced laminate may be placed at the center. On the surfaces of the ultra-thin copper layer or the carrier arranged in the outermost layer of any of these laminates (hereinafter also referred to as laminate A), two layers including a resin layer and a circuit are provided once or more than once, and after providing the two layers once or more than once, a coreless substrate may be produced by detaching the ultra-thin copper layer or the carrier of each carrier-attached copper foil from the carrier or the ultra-thin copper layer, respectively. Note that the two layers including a resin layer and a circuit may be deposited in the order of a resin layer and a circuit or in the order of a circuit and a resin layer. The above-described laminates may have another layer or other layers on the surface of the ultra-thin copper layer, on the surface of the carrier, between the carriers, between the ultra-thin copper layers, and between the carrier and the ultra-thin copper layer. Such another layer or other layers may be a resin substrate or a resin layer. Note that in this specification, when an ultra-thin copper layer, a carrier, or a laminate has another layer or other layers on its surface, "surface of an/the ultra-thin copper layer", "surface on an/the ultra-thin copper layer side", "an/the ultra-thin copper layer surface", "surface of a/the carrier", "surface on a/the carrier side", "a/the carrier surface", "surface of a/the laminate", and "a/the laminate surface" refer to the outermost surface of the ultra-thin copper layer, the carrier, or the laminate, or in other words, the concept of these terms includes the surface of such another layer or other layers. The laminate preferably has a configuration of an ultra-thin copper layer/an intermediate layer/a carrier/a carrier/an intermediate layer/an ultra-thin copper layer. This is because at the time of producing a coreless substrate by using such a laminate, an ultra-thin copper layer is arranged on the coreless substrate side and a circuit can be readily formed on the coreless substrate by using the modified semi-additive method. Another reason is that because an ultra-thin copper layer is thin, the ultra-thin copper layer can be readily removed and a circuit can be readily formed on the coreless substrate by using the semi-additive method after the removal of the ultra-thin copper layer.

Note that in this specification, "laminate" that is not specifically written as "laminate A" or "laminate B" refers to a laminate that includes at least laminate A and laminate B.

Note that in the above-described method of manufacturing a coreless substrate, by covering a portion or all of edge face(s) of the carrier-attached copper foil or the above-described laminate (including laminate A) with a resin, penetration of chemical into the intermediate layer or between carrier-attached copper foils that configure the laminate can be prevented at the time of manufacturing a printed wiring board by using the buildup technique. As a result, separation between an ultra-thin copper layer and a carrier and corrosion of carrier-attached copper foils that are caused by the penetration of chemical can be prevented and consequently yield can be improved. "A resin to cover a portion or all of edge face(s) of the carrier-attached copper foil" or "a resin to cover a portion or all of edge face(s) of the laminate" used herein can be a resin that can be used for the resin layer or a resin known in the art. In the above-described method of manufacturing a coreless substrate, at least a portion of outer edge of the laminated portion of the carrier-attached copper foil or the laminate (a laminated portion of the carrier and the ultra-thin copper layer, the laminated portion possibly including the intermediate layer and/or one or more layers, or a laminated portion of one carrier-attached copper foil and another carrier-attached copper foil, the laminated portion possibly including one or more layers) as viewed planarly may be covered with a resin or a prepreg. The laminate (laminate A) formed by the above-described method of manufacturing a coreless substrate may be configured by bringing a pair of carrier-attached copper foils into contact with each other in such a manner that the carrier-attached copper foils can be separated. Moreover, all of outer edge or allover the laminated portion of the carrier-attached copper foil or the laminate (a laminated portion of the carrier and the ultra-thin copper layer, the laminated portion possibly including the intermediate layer and/or one or more layers, or a laminated portion of one carrier-attached copper foil and another carrier-attached copper foil, the laminated portion possibly including one or more layers) as viewed planarly may be covered with a resin or a prepreg. The resin or the prepreg as viewed planarly is preferably larger than the carrier-attached copper foil, the laminate, or the laminated portion, and the resultant carrier-attached copper foil or the laminate preferably has a structure in which the resin or the prepreg is deposited on both surfaces of the carrier-attached copper foil or the laminate and the carrier-attached copper foil or the laminate is wrapped (enveloped) by the resin or the prereg. In such a structure, when the carrier-attached copper foil or the laminate is viewed planary, because outer an edge or edges of the laminated portion of the carrier-attached copper foil or the laminate are covered with the resin or the prepreg, it is possible to prevent another component or other components from directly contacting the carrier-attached copper foil or the laminate from a side direction, i.e., a lateral direction with respect to the direction of lamination, and as a result, the carrier becomes less likely to be detached from the ultra-thin copper layer or the carrier-attached copper foils become less likely to be detached from one another during handling. In addition, by covering the outer edges of the laminated layers of the carrier-attached copper foil or the laminate with a resin or a prepreg so as not to expose the carrier-attached copper foil or the laminate, as described above, penetration of chemical into an interface of the laminated layers can be prevented in a process of chemical treatment, and therefore corruption and erosion of the carrier-attached copper foil can be prevented. Note that at the time of separating one of a pair of carrier-attached copper foils in a laminate from another or separating a carrier from a copper foil (ultra-thin copper layer) in a carrier-attached copper foil, when a laminated portion of a carrier-attached copper foil or a laminate (a laminated portion of the carrier and the ultra-thin copper layer, the laminated portion possibly including the intermediate layer and/or one or more layers, or a laminated portion of one carrier-attached copper foil and another carrier-attached copper foil, the laminated portion possibly including one or more layers) that is covered with a resin or a prepreg are strongly adhered to each other by the resin or the prepreg, the adhered portion of the laminated portion may need to be removed by cutting the portion off etc.

It is also possible to configure a laminate by depositing a carrier-attached copper foil of the present invention from its carrier side or its ultra-thin copper layer side on a carrier side or an ultra-thin copper layer side of another carrier-attached copper foil. Alternatively, the laminate may be obtained by directly bonding a carrier side surface or an ultra-thin copper layer side surface of one carrier-attached copper foil of the present invention to a carrier side surface or an ultra-thin copper layer side surface of another carrier-attached copper foil via an adhesive when needed. The carrier or the ultra-thin copper layer of such a carrier-attached copper foil may be joined to the carrier or the ultra-thin copper layer of such another carrier-attached copper foil. Here, "joining" includes a mode in which, when a carrier or an ultra-thin copper layer has a surface treated layer, the carrier or the ultra-thin copper layer is joined via the surface treated layer. In addition, a portion or all of edge face(s) of such a laminate may be covered with a resin.

In addition to merely depositing layers, the following methods can be used for example for lamination of carriers, lamination of ultra-thin copper layers, lamination of a carrier and an ultra-thin copper layer, and lamination of carrier-attached copper foils.

(a) Metallurgical joining methods: fusion welding (arc welding, TIG (Tungsten Inert Gas) welding, MIG (Metal Inert Gas) welding, resistance welding, seam welding, spot welding), pressure welding (ultrasonic welding, friction stir welding), brazing and soldering;
(b) Mechanical joining methods: joining by swaging, riveting (joining by self-piercing rivets, riveting), stitcher;
(c) physical joining methods: adhesive, (two-sided) adhesive tape.

By joining a portion of or all of one carrier to a portion of or all of another carrier or a portion of or all of an ultra-thin copper layer by using any of the above joining methods, one carrier can be layered onto another carrier or an ultra-thin copper layer, and it is therefore possible to manufacture a laminate configured by bringing the carriers or the carrier and the ultra-thin copper layer into separable contact with each other. When one carrier and another carrier or an ultra-thin copper layer are laminated by weak joining of the carriers or the carrier and the ultra-thin copper layer, the carriers or the carrier and the ultra-thin copper layer can be separated from each other without removing the joining of the carriers or the carrier and the ultra-thin copper layer. When one carrier and another carrier or an ultra-thin copper layer are strongly joined together, the carriers or the carrier and the ultra-thin copper layer can be separated from each other by removing a site where the carriers or the carrier and the ultra-thin copper layer are joined by cutting the site off, chemical milling (etching etc.), and mechanical milling and other techniques.

A printed wiring board that does not have a core may be produced by performing a step of providing two layers including a resin layer and a circuit at least once on the laminate described above, and a step of detaching the carrier or the ultra-thin copper layer from the carrier-attached copper foil after forming the two layers including a resin layer and a circuit. Note that the two layers including a resin layer and a circuit may be provided on one surface or each of both surfaces of the laminate. Note that the two layers including a resin layer and a circuit may be provided in the order of a resin layer and a circuit or in the order of a circuit and a resin layer.

A resin substrate, a resin layer, a resin, a prepreg used in the laminate described above may be the resin layer described in this specification and may contain any of the resin, the resin curing agent, the compound, the curing accelerator, the dielectric substance, the reaction catalyst, the crosslinking agent, the polymer, the prepreg, the skeletal material, and others that are used for the resin layer described in this specification.

Note that the above-described carrier-attached copper foil or laminate may be smaller than the resin, the prepreg, the resin substrate or the resin layer as viewed planarly.

EXAMPLE

The present invention will be described below in more detail by Examples of the present invention. The present invention is not limited by these Examples.

Examples 1-13 and Comparative Examples 1-18

1. Production of a Carrier-Attached Copper Foil

As a copper foil carrier, a long length of an electrolytic copper foil having a thickness of 35 μm (JTC manufactured by JX Nippon Mining & Metals Corporation) and a long length of a rolled copper foil having a thickness of 35 μm (a foil of tough-pitch copper specified by JIS H3100 C1100 manufactured by JX Nippon Mining & Metals Corporation) were prepared. On the shiny face of the prepared copper foil carrier, an electroplating of Ni layer was performed under the following conditions, using a roll-to-roll continuous plating line, and thus a Ni layer having a deposition amount of 4,000 μg/dm$^2$ was formed.
Ni Plating
Nickel sulfate: 250-300 g/L
Nickel chloride: 35-45 g/L
Nickel acetate: 10-20 g/L
Boric acid: 15-30 g/L
Brightener: Saccharine, butynediol or others
Dodecyl sodium sulfate: 30-100 ppm
pH: 4-6
Bath temperature: 50-70° C.
Current density: 3-15 A/dm$^2$ After rinsing with water and pickling, a Cr layer was subsequently deposited by electrolytic chromate treatment on the Ni layer in a deposition amount of 11 μg/dm$^2$ using a roll-to-roll continuous plating line under the following conditions.
Electrolytic Chromate Treatment
Composition of solution: potassium dichromate: 1-10 g/L and Zinc 0-5 g/L
pH: 3-4
Solution temperature: 50-60° C.
Current density: 0.1-2.6 A/dm$^2$
Quantity of coulomb: 0.5-30 As/dm$^2$ Note that an intermediate layer is provided in each of Examples 11, 12, and 13 as described below.

Example 11

(1) Ni—Mo Layer (Nickel Molybdenum Alloy Plating)

On the carrier, an electroplating of Ni—Mo layer was performed under the following conditions, using a roll-to-roll continuous plating line, and thus a Ni—Mo layer having a deposition amount of 3,000 μg/dm$^2$ was formed. Details of the plating conditions are provided below. (Composition of solution) nickel(II) sulfate hexahydrate: 50 g/dm$^3$, sodium molybdate dehydrate: 60 g/dm$^3$, sodium citrate: 90 g/dm$^3$
(Solution temperature) 30° C.
(Current density) 1-4 A/dm$^2$
(Current-carrying time) 3-25 seconds Example 12

(1) Ni Layer (Nickel Plating)

A Ni layer was formed under the conditions that are the same as the conditions in Example 1.

(2) Organic Layer (Organic Layer Formation Treatment)

After rinsing with water and pickling the surface of the Ni layer formed in (1), an organic layer was subsequently deposited by spraying a solution containing 1-30 g/L concentration of carboxy benzotriazole (CBTA) by showering for 20-120 seconds on the Ni layer under the conditions of temperature being at 40° C. and pH being 5.

Example 13

(1) Co—Mo Layer (Cobalt Molybdenum Alloy Plating)

On the carrier, an electroplating of Co—Mo layer was performed under the following conditions, using a roll-to-roll continuous plating line, and thus a Co—Mo layer having a deposition amount of 4,000 μg/dm$^2$ was formed. Details of the plating conditions are provided below. (Composition of solution) cobalt sulfate: 50 g/dm$^3$, sodium molybdate dehydrate: 60 g/dm$^3$, sodium citrate: 90 g/dm$^3$
(Solution temperature) 30° C.
(Current density) 1-4 A/dm$^2$
(Current-applying time) 3-25 seconds Subsequently, in the roll-to-roll continuous plating line, an ultra-thin copper layer having a thickness provided in Table 1 was formed on the intermediate layer by electroplating under the conditions of electrolytic solution provided in Table 1, and a carrier-attached copper foil was ultimately manufactured.

For Examples 1, 4, and 12 and Comparative Example 1, surface treatments such as roughening treatment were performed on the surface of the ultra-thin copper layer of the carrier-attached copper foil obtained by the above-described methods in the order of roughening treatment, rustproofing treatment, chromate treatment, and silane coupling treatment as described below.

Roughening Treatment
Cu: 5-30 g/L (added as copper(II) sulfate pentahydrate)
$H_2SO_4$: 30-120 g/L
W: 10 mg/L (added as sodium tungstate(VI) dehydrate)
Solution temperature: 30° C.
Current density Dk: 20-40 $A/dm^2$
Time: 4 seconds
Rustproofing Treatment
Zn: more than 0 g/L-20 g/L
Ni: more than 0 g/L-5 g/L
pH: 2.5-4.5
Solution temperature: 30-50° C.
Current density Dk: more than 0 $A/dm^2$-1.7 $A/dm^2$
Time: 1 second
Deposit amount of Zn: 5-250 $\mu g/dm^2$
Deposit amount of Ni: 5-300 $\mu g/dm^2$
Chromate Treatment
$K_2Cr_2O_7$
($Na_2Cr_2O_7$ or $CrO_3$): 2-10 g/L
NaOH or KOH: 10-50 g/L
ZnO or $ZnSO_4.7H_2O$: 0.05-10 g/L
pH: 7-13
Bath temperature: 20-80° C.
Current density: 0.05-5 $A/dm^2$
Time: 5-30 seconds
Deposit amount of Cr: 10-150 $\mu g/dm^2$
Silane Coupling Treatment
Solution of vinyl triethoxy silane
(vinyl triethoxy silane concentration: 0.1-1.4 wt %)
pH: 4-5
Bath temperature: 25-60° C.
Immersion time: 5-30 seconds Regarding the carrier-attached copper foils for Examples and Comparative Examples obtained under the conditions provided above, evaluations were performed in the following methods.

<Measurement of Ten Point Average Roughness Rz>

The ten point average roughness Rz of the surface on the ultra-thin copper layer side was measured in accordance with the method specified in JIS B0601-1982 by using a stylus roughness measurement device Surfcorder Model SE-3C manufactured by Kosaka Laboratory Ltd. The measurement was conducted in a TD direction (width direction or a direction perpendicular to a direction (MD direction) to which a carrier is carried in an apparatus that forms an ultra-thin copper layer). The measurement was conducted ten times at different measurement positions under the following conditions: measurement length: 0.8 mm, evaluation length: 4 mm, cutoff value: 0.25 mm, measuring speed: 0.1 mm/sec. The surface roughness Rz was obtained from an average value of the ten measured values.

<Number of Crystal Grains Per Unit Cross-Sectional Area of Ultra-Thin Copper Layer in Through-Thickness Direction>

Regarding a cross section of an ultra-thin copper layer of the produced carrier-attached copper foil in a direction parallel to the through-thickness direction, a cross-sectional photo was observed by using a focused in beam processing device SMI3050 (FIB) available from Seiko Instruments Inc. A site having the same color depth or color contrast was regarded as one crystal grain for the measurement. The measurement magnification and the breadth of measured visual field may be varied in accordance with the crystal grain size of the cross section of the ultra-thin copper layer. However, the measured visual field needs to include at least a crystal grain on a surface on the carrier side of the ultra-thin copper layer and at least a crystal grain on a surface on a side opposite to the carrier side. When the numbers and the sizes of the crystal grains on the surface on the carrier side of the ultra-thin copper layer and of the crystal grains on the surface on the side opposite to the carrier side are measured in different visual fields, the number of visual fields including the crystal grains on the surface on the carrier side of the ultra-thin copper layer and the number of visual fields including the crystal grains on the surface on the side opposite to the carrier side of the ultra-thin copper layer need to be the same. This is because in some cases the metallographic state can be different between a surface on a carrier side and a surface on a side opposite to the carrier side of an ultra-thin copper layer. Moreover, in order to evaluate average metallographic state of the ultra-thin copper layer, the breadth of each measured visual field and the number of measured visual fields are selected so as to conduct measurements of 60 crystal grains or more in total. In this specification, measurement of the number of crystal grains and measurement of an average crystal grain size were conducted in a measured visual field that covers all of the ultra-thin copper layer in the through-thickness direction. For example, in the case of an ultra-thin copper layer with its average crystal grain size being 0.7-1.5 $\mu m$, the breadth of one visual field is the size of length 8 $\mu m$ in a direction perpendicular to the through-thickness direction of the ultrathin copper layer × ("×" is multiplication sign) the thickness of the ultrathin copper layer, and the measurement of the number of crystal grains and the measurement of an average crystal grain size was conducted in 3-4 visual fields.

Additionally, the measurement were conducted in three visual fields, and an average value of the grain sizes of crystal grains measured in the three visual fields was made the average crystal grain size. Moreover, the total value of the number of crystal grains observed in the three visual fields divided by the total area of the measured visual fields was made the number of crystal grains per unit area ($\mu m^2$). For a surface area on the side opposite to the carrier side of the ultra-thin copper layer, the number of crystal grains per unit cross-sectional area (grains/$\mu m^2$) in a cross section taken parallel to the through-thickness direction was also measured in three visual fields. Here, the surface area refers to a portion of a cross section taken parallel to the through-thickness direction of the ultra-thin copper layer and the area includes 50 percent of the thickness of the ultra-thin copper layer from the surface on the side opposite to the carrier side of the ultra-thin copper layer.

Note that the grain size of each crystal grain was measured by measuring the minimum diameter of a circuit that surrounds the crystal grain.

Furthermore, when a crystal grain as a whole was not fully covered by the measured visual field, the crystal grain was not counted as one crystal grain. Such a crystal grain was not counted in the measurement of the number of crystal grains. Therefore, the size of such a crystal grain was not measured, or such a crystal grain was not included in calculation of the average crystal grain size.

<Average Grain Size of Crystal Grains that Form an Ultra-Thin Copper Layer in a Cross Section Taken in a Direction Parallel to a Through-Thickness Direction of the Ultra-Thin Copper Layer>

In the cross-sectional photo of the ultra-thin copper layer obtained by the above-described FIB obtained at the time of measuring "the number of crystal grains per unit cross-sectional area of the ultra-thin copper layer in the through-thickness direction", a smallest possible circle that surrounds a crystal grain was drawn for every crystal grains counted at the time of measuring "the number of crystal grains per unit cross-sectional area of the ultra-thin copper layer in the through-thickness direction" by using Excel™ which is spreadsheet software of Microsoft Corporation. The diameter of the smallest possible circle was regarded as the size of crystal grain. Values of the size of crystal grain obtained from every crystal grains were averaged to obtain an average grain size of crystal grains that form the ultra-thin copper layer.

<Chemical Etching Uniformity (Circuit Formability)>

After performing chemical etching treatment on the ultra-thin copper layer of the carrier-attached copper foil aiming at the etching amount of 1 μm by using CZ-8101 available from MEC Company Ltd. as a chemical etchant, a cross-sectional photo of a cross section in a direction parallel to the through-thickness direction of the ultra-thin copper layer was observed by using FIB. Note that the etching amount (1 μm) is an amount of the etching that also serves as a pretreatment of plating resist. In this observation of the cross section of the ultra-thin copper layer, when a difference between the maximum thickness and the minimum thickness of the ultra-thin copper layer was 0.5 μm or less, the uniformity was evaluated as circle mark, or good, and when the difference was greater than 0.5 μm, the uniformity was evaluated as X-mark, or not good.

<Adhesion with Dry Film>

As described in the evaluation of chemical etching uniformity, after performing the chemical etching treatment on the ultra-thin copper layer, the carrier-attached copper foil was deposited on a dry film in a manner that the side on which the chemical etching was performed was attached to the dry film by thermocompression with 20 kg/cm² at 220° C. for two hours. Subsequently, a tension was applied from the carrier side by a tensile tester, a peeling strength when the dry film was peeled from the carrier-attached copper foil was measured in accordance with JIS C6471 8.1, and the adhesion was evaluated. When the peeling strength was 0.5 kgf/cm or greater, the adhesion was evaluated as circle mark, or good, and when the peeling strength was less than 0.5 kgf/cm, the adhesion was evaluated as X-mark, or not good.

<Etching Speed>

The following resin substrate with a size of 6.25 cm×6.25 cm×100 μm (thickness) was prepared, the resin substrate and the carrier-attached copper foil were laminate-pressed so that the surface on the ultra-thin copper layer of the carrier-attached copper foil was brought into contact with the resin substrate. The laminate press was performed under the following conditions: press pressure: 3 Mpa, heating temperature and time: 220° C. for two hours.

Used resin: GHPL-830MBT manufactured by MITSUBISHI GAS CHEMICAL COMPANY, INC.

A starting material used next was produced by detaching the carrier from the carrier-attached copper foil on the resin substrate and had an ultra-thin copper layer laminated on the resin substrate. Etching was performed on the ultra-thin copper layer of the starting material under the following conditions.

(Etching Conditions)
etching type: spray etching
spray nozzle: full cone nozzle
spray pressure: 0.10 MPa
etchant temperature: 30° C.
etchant composition:
$H_2O_2$ 18 g/L
$H_2SO_4$ 92 g/L
Cu 8 g/L
Additive FE-830IIW3C available from JCU Corporation proper amount
Etching treatment time: 10-300 seconds The amount of etching on the ultra-thin copper layer and the speed of etching on the ultra-thin copper layer were calculated from the following equation using the difference in weight before and after the etching treatment (weight before etching treatment—weight after etching treatment).

Amount of etching on ultra-thin copper layer(μm)=difference in weight(g)/[copper density(8.93 g/cm³)/area(6.25×6.25 cm²)]×10000

Speed of etching on ultra-thin copper layer(μm/s)=amount of etching calculated above (μm)/etching treatment time(s)

Note that when a surface treated layer is provided on a side opposite to the carrier side of the ultra-thin copper layer, the measurement of the speed of etching on the ultra-thin copper layer is ended before the surface treated layer is etched. This is for the purpose of eliminating the influence of the surface treated layer on the speed of etching on the ultra-thin copper layer. Note that a precision balance that was used for weight measurement can measure the weight to four decimal places and the measured value was rounded to three decimal places. Also note that when the speed of etching was 0.02 μm/s or faster, the speed was evaluated as circle mark, or good, and when the speed of etching was slower than 0.02 μm/s, the speed was evaluated as X-mark, or not good.

Testing conditions and testing results are provided in Table 1 and Table 2.

TABLE 1

| | | Ultra-thin copper layer manufacturing conditions Conditions of electrolyte (the balance is water. ppm indicates mass ppm unless otherwise designated) | | | | |
|---|---|---|---|---|---|---|
| | Carrier | Copper concentration (g/L) | Sulfuric acid concentration (g/L) | Chlorine concentration (wtppm) | Glue concentration (wtppm) | SPS concentration (wtppm) |
| Example 1 | Electrolytic copper foil | 110 | 65 | 65 | 10 | 0 |
| Example 2 | Electrolytic copper foil | 120 | 70 | 70 | 0 | 55 |
| Example 3 | Electrolytic copper foil | 130 | 65 | 0 | 1 | 0 |
| Example 4 | Electrolytic copper foil | 150 | 50 | 0 | 1 | 0 |
| Example 5 | Electrolytic copper foil | 110 | 85 | 65 | 10 | 0 |
| Example 6 | Electrolytic copper foil | 130 | 65 | 0 | 1 | 0 |
| Example 7 | Rolled copper foil | 120 | 70 | 70 | 4 | 55 |
| Example 8 | Electrolytic copper foil | 120 | 70 | 70 | 4 | 55 |
| Example 9 | Electrolytic copper foil | 120 | 70 | 70 | 0 | 55 |
| Example 10 | Rolled copper foil | 120 | 70 | 70 | 0 | 55 |
| Example 11 | Electrolytic copper foil | 120 | 70 | 70 | 0 | 80 |

TABLE 1-continued

| | | | | | | |
|---|---|---|---|---|---|---|
| Example 12 | Electrolytic copper foil | 120 | 70 | 70 | 0 | 100 |
| Example 13 | Rolled copper foil | 120 | 70 | 70 | 4 | 50 |
| Comparative Example 1 | Electrolytic copper foil | 90 | 100 | 30 | 4 | 0 |
| Comparative Example 2 | Electrolytic copper foil | 80 | 80 | 0 | 10 | 0 |
| Comparative Example 3 | Electrolytic copper foil | 180 | 30 | 60 | 0 | 200 |
| Comparative Example 4 | Electrolytic copper foil | 180 | 30 | 60 | 0 | 120 |
| Comparative Example 5 | Electrolytic copper foil | 80 | 80 | 60 | 6 | 0 |
| Comparative Example 6 | Electrolytic copper foil | 90 | 80 | 0 | 3 | 0 |
| Comparative Example 7 | Electrolytic copper foil | 90 | 80 | 0 | 3 | 0 |
| Comparative Example 8 | Electrolytic copper foil | 100 | 100 | 50 | 0 | 30 |
| Comparative Example 9 | Electrolytic copper foil | 90 | 80 | 0 | 8 | 0 |
| Comparative Example 10 | Electrolytic copper foil | 100 | 100 | 50 | 0 | 30 |
| Comparative Example 11 | Rolled copper foil | 90 | 80 | 0 | 3 | 0 |
| Comparative Example 12 | Rolled copper foil | 90 | 80 | 0 | 3 | 0 |
| Comparative Example 13 | Rolled copper foil | 90 | 80 | 0 | 3 | 0 |
| Comparative Example 14 | Electrolytic copper foil | 90 | 80 | 0 | 0 | 0 |
| Comparative Example 15 | Rolled copper foil | 90 | 80 | 0 | 0 | 0 |
| Comparative Example 16 | Electrolytic copper foil | 89.1 | 110 | 30 | 4 | 0 |
| Comparative Example 17 | Electrolytic copper foil | 61.1 | 60 | 30 | 0 | 0 |
| Comparative Example 18 | Electrolytic copper foil | 89.1 | 110 | 30 | 2 | 0 |

| | Ultra-thin copper layer manufacturing conditions | | | |
|---|---|---|---|---|
| | Conditions of electrolyte (the balance is water. ppm indicates mass ppm unless otherwise designated) | | Electrolyte temperature (° C.) | Current density (A/dm$^2$) | Electrolyte linear flow rate (m/sec) |
| | amine compound concentration (wtppm) | Other additive | | | |
| Example 1 | 0 | 0 | 75 | 25 | 5.5 |
| Example 2 | 55 | 0 | 65 | 30 | 4.5 |
| Example 3 | 0 | 0 | 65 | 70 | 3.5 |
| Example 4 | 0 | 0 | 75 | 30 | 5.0 |
| Example 5 | 0 | 0 | 75 | 2.5 | 5.5 |
| Example 6 | 0 | 0 | 65 | 70 | 3.5 |
| Example 7 | 55 | 0 | 60 | 80 | 4.5 |
| Example 8 | 55 | 0 | 60 | 80 | 4.5 |
| Example 9 | 55 | 0 | 65 | 30 | 4.5 |
| Example 10 | 55 | 0 | 65 | 30 | 4.5 |
| Example 11 | 55 | 0 | 65 | 30 | 4.5 |
| Example 12 | 55 | 0 | 65 | 30 | 4.5 |
| Example 13 | 50 | 0 | 60 | 80 | 4.1 |
| Comparative Example 1 | 0 | 0 | 60 | 85 | 4.0 |
| Comparative Example 2 | 0 | 0 | 60 | 85 | 5.0 |
| Comparative Example 3 | 80 | 0 | 60 | 100 | 5 |
| Comparative Example 4 | 30 | 0 | 60 | 120 | 4 |
| Comparative Example 5 | 0 | 0 | 60 | 120 | 4 |
| Comparative Example 6 | 0 | 0 | 60 | 85 | 4.0 |
| Comparative Example 7 | 0 | 0 | 65 | 50 | 4.0 |
| Comparative Example 8 | 39 | 0 | 65 | 50 | 3.0 |
| Comparative Example 9 | 0 | 0 | 60 | 85 | 5.0 |
| Comparative Example 10 | 39 | 0 | 45 | 50 | 3.0 |
| Comparative Example 11 | 0 | 0 | 60 | 78 | 4.0 |
| Comparative Example 12 | 0 | 0 | 60 | 78 | 4.0 |
| Comparative Example 13 | 0 | 0 | 60 | 78 | 4.0 |
| Comparative Example 14 | 0 | 0 | 40 | 30 | 1.5 |
| Comparative Example 15 | 0 | 0 | 40 | 30 | 1.5 |
| Comparative Example 16 | 0 | Sodium 3-Mercapto-1-propanesulfonate 1 ppm Hydroxyethyl cellulose 4 ppm | 50 | 30 | 0.01 |
| Comparative Example 17 | 0 | Cupracid 210, a product of Nihon Schering K. K. Makeup agent: 10 cc/l Gloss agent (A): 0.5 cc/l Gloss agent (B): used only for replenishment For replenishment of gloss agent, 300 cc of gloss agent (A) and 300 cc of gloss agent (B) are added per 1000 ampere hour | 35 | 10 | 0.01 |
| Comparative Example 18 | 0 | 0 | 50 | 30 | 0.01 |

TABLE 2

| | Carrier | Thickness of ultra-thin copper layer (μm) | Surface roughness Rz (μm) | Number of crystal grains per unit cross-sectional area in cross section of ultra-thin copper layer in through-thickness direction (entire thickness of ultra-thin copper layer) (quantity/μm$^2$) | Number of crystal grains per unit cross sectional area in cross section of surface area on side opposite to carrier side of ultra-thin copper layer (quantity/μm$^2$) | Average crystal grain size in cross section (μm) | Average crystal grain size on surface (μm) | Average crystal grain size measured by linear analysis in direction perpendicular to through-thickness direction (μm) | Chemical etching uniformity | Difference between maximum thickness and minimum thickness (average value of three visual fields) | Adhesion with dry film | Etching speed |
|---|---|---|---|---|---|---|---|---|---|---|---|---|
| Example 1 | Electrolytic copper foil | 5 | 0.8 | 0.2 | 0.2 | 5 | 5 | 2.5 | ◯ | 0.2 | ◯ | ◯ |
| Example 2 | Electrolytic copper foil | 5 | 0.6 | 1.0 | 0.9 | 2 | 2 | 1.0 | ◯ | 0.3 | ◯ | ◯ |
| Example 3 | Electrolytic copper foil | 5 | 1.1 | 4 | 3 | 0.8 | 1.0 | 0.6 | ◯ | 0.5 | ◯ | ◯ |
| Example 4 | Electrolytic copper foil | 2 | 1.1 | 1.2 | 1.1 | 0.8 | 1.0 | 0.6 | ◯ | 0.5 | ◯ | ◯ |
| Example 5 | Electrolytic copper foil | 3 | 0.9 | 0.2 | 0.2 | 6.5 | 6 | 4.0 | ◯ | 0.5 | ◯ | ◯ |
| Example 6 | Electrolytic copper foil | 3 | 1 | 4.7 | 5.0 | 0.7 | 1 | 0.5 | ◯ | 0.5 | ◯ | ◯ |
| Example 7 | Rolled copper foil | 5 | 0.3 | 1.4 | 1.3 | 1.7 | 2 | 1.0 | ◯ | 0.4 | ◯ | ◯ |
| Example 8 | Electrolytic copper foil | 5 | 0.8 | 1.2 | 1.2 | 2.1 | 2 | 1.5 | ◯ | 0.4 | ◯ | ◯ |
| Example 9 | Electrolytic copper foil | 1.5 | 1.1 | 1.1 | 1.1 | 2 | 2 | 1.0 | ◯ | 0.3 | ◯ | ◯ |
| Example 10 | Rolled copper foil | 1.5 | 0.4 | 0.8 | 0.7 | 2.5 | 2 | 1.0 | ◯ | 0.3 | ◯ | ◯ |
| Example 11 | Electrolytic copper foil | 1.5 | 1 | 1.2 | 1 | 1.8 | 2 | 1.2 | ◯ | 0.4 | ◯ | ◯ |
| Example 12 | Electrolytic copper foil | 1.5 | 0.9 | 1 | 1 | 1.9 | 2 | 0.8 | ◯ | 0.4 | ◯ | ◯ |
| Example 13 | Rolled copper foil | 3 | 0.3 | 1.7 | 1.6 | 1.3 | 1.5 | 1.0 | ◯ | 0.4 | ◯ | ◯ |
| Comparative Example 1 | Electrolytic copper foil | 5 | 2.2 | 6 | 6 | 1.2 | 1.0 | 0.3 | X | 0.8 | ◯ | ◯ |
| Comparative Example 2 | Electrolytic copper foil | 5 | 1.7 | 10 | 8 | 0.2 | 0.2 | 0.2 | X | 1 | ◯ | ◯ |
| Comparative Example 3 | Electrolytic copper foil | 5 | 0.05 | 3 | 3 | 3 | 3 | 0.9 | ◯ | 0.2 | X | ◯ |
| Comparative Example 4 | Electrolytic copper foil | 3 | 0.5 | 0.05 | 0.04 | 7 | 5 | 1.0 | ◯ | 0.1 | ◯ | X |
| Comparative Example 5 | Electrolytic copper foil | 3 | 2.3 | 4.3 | 3.7 | 0.7 | 0.5 | 0.5 | X | 1.2 | ◯ | ◯ |
| Comparative Example 6 | Electrolytic copper foil | 2.0 | 2.3 | 8 | 8 | 0.4 | 0.1 | 0.05 | X | 1.2 | ◯ | ◯ |
| Comparative Example 7 | Electrolytic copper foil | 2.0 | 2.4 | 8 | 8 | 0.4 | 0.5 | 0.18 | X | 0.8 | ◯ | ◯ |
| Comparative Example 8 | Electrolytic copper foil | 2.0 | 1.3 | 6 | 7 | 0.4 | 0.4 | 0.28 | X | 0.9 | ◯ | ◯ |
| Comparative Example 9 | Electrolytic copper foil | 2.0 | 1.8 | 6 | 7 | 0.3 | 0.5 | 0.01 | X | 2 | ◯ | ◯ |
| Comparative Example 10 | Electrolytic copper foil | 2.0 | 1.4 | 6 | 6 | 0.4 | 0.5 | 0.5 | X | 0.7 | ◯ | ◯ |
| Comparative Example 11 | Rolled copper foil | 2.0 | 2.4 | 9 | 6 | 0.3 | 0.2 | 0.1 | X | 1 | ◯ | ◯ |
| Comparative Example 12 | Rolled copper foil | 1.0 | 2.2 | 9 | 6 | 0.3 | 0.3 | 0.1 | X | 1.1 | ◯ | ◯ |
| Comparative Example 13 | Rolled copper foil | 5.0 | 2.9 | 9 | 6 | 0.3 | 0.3 | 0.1 | X | 1.1 | ◯ | ◯ |
| Comparative Example 14 | Electrolytic copper foil | 2.0 | 2.7 | 6 | 6 | | | | | | | |
| Comparative Example 15 | Rolled copper foil | 2.0 | 2.2 | 6 | 6 | | | | | | | |
| Comparative Example 16 | Electrolytic copper foil | 5 | 1.1 | 6 | 6 | | | | | | | |
| Comparative Example 17 | Electrolytic copper foil | 5 | 0.9 | 7 | 6 | | | | | | | |
| Comparative Example 18 | Electrolytic copper foil | 5 | 2.6 | 5 | 2 | | | | | | | |

TABLE 2-continued

| | | | | | | | |
|---|---|---|---|---|---|---|---|
| Comparative Example 14 | 0.6 | 0.5 | 0.6 | X | 0.6 | ○ | ○ |
| Comparative Example 15 | 0.6 | 0.5 | 0.6 | X | 0.8 | ○ | ○ |
| Comparative Example 16 | 0.5 | 1.5 | 0.6 | X | 0.6 | ○ | ○ |
| Comparative Example 17 | 0.8 | 0.8 | 0.5 | X | 0.6 | ○ | ○ |
| Comparative Example 18 | 2.5 | 2.8 | 1.5 | X | 0.7 | ○ | X |

(Evaluation Result)

In each of Examples 1-13, the number of crystal grains per unit cross-sectional area of the ultra-thin copper layer in the through-thickness direction was 0.1 to 5 grains/μm² and the ten point average roughness Rz of the surface on the ultra-thin copper layer side was 0.1-2.0 μm. Therefore the chemical etching uniformity, the adhesion with dry film, and the speed of etching were satisfactory. For that reason, all of Examples 1-13 are considered to have good circuit formability.

In Comparative Examples 1-18, the number of crystal grains per unit cross-sectional area of the ultra-thin copper layer in the through-thickness direction did not fall within 0.1 to 5 grains/μm² and/or the ten point average roughness Rz of the surface on the ultra-thin copper layer side did not fall within 0.1-2.0 μm. Therefore at least one of the chemical etching uniformity, the adhesion with dry film, and the speed of etching was unsatisfactory. For that reason, none of Comparative Examples 1-18 is considered to have good circuit formability.

Figure 5:
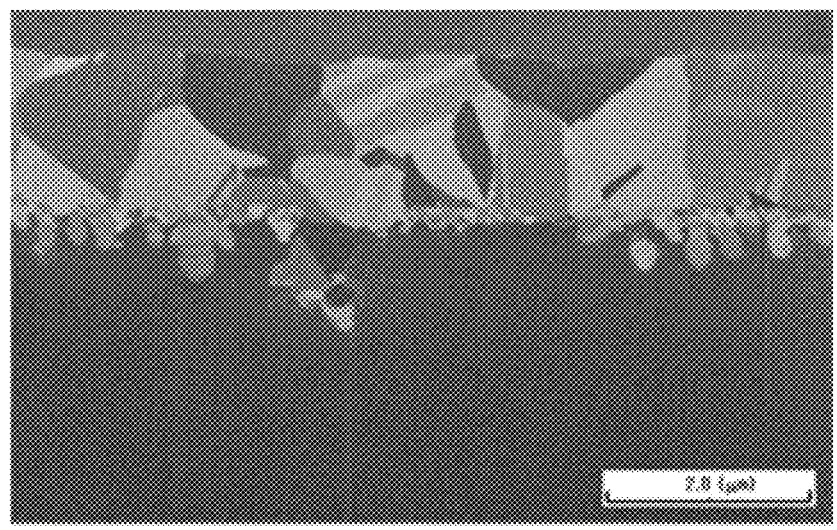
FIG. 5 is a cross-sectional view of a cross section taken parallel to a through-thickness direction of the ultra-thin copper layer of Example 4.
Figure 6:
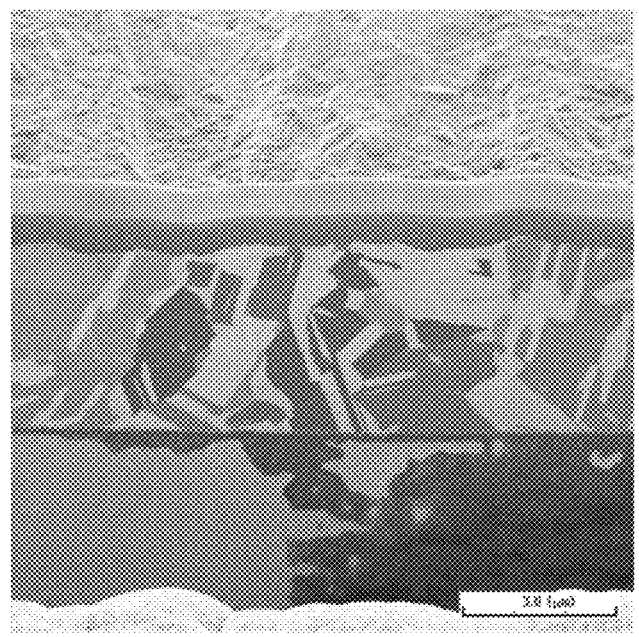
FIG. 6 is a cross-sectional view of a cross section taken parallel to a through-thickness direction of the ultra-thin copper layer of Example 13.

FIG. 5 provides a cross-sectional view of a cross section taken parallel to the through-thickness direction of the ultra-thin copper layer of Example 4. FIG. 6 provides a cross-sectional view of a cross section taken parallel to the through-thickness direction of the ultra-thin copper layer of Example 13.

The invention claimed is:

1. A carrier-attached copper foil having a carrier, an intermediate layer and an ultra-thin copper layer having a thickness of 0.1 and 12 μm in this order,
   wherein a number of crystal grains per unit cross-sectional area of the ultra-thin copper layer in a through-thickness direction is 0.1 to 5 grains/μm², and a ten point average roughness Rz of a surface on a side of the ultra-thin copper layer is 0.1 to 2.0 μm.

2. The carrier-attached copper foil according to claim 1, wherein the ten point average roughness Rz of the surface on the side of the ultra-thin copper layer is 0.11 to 1.9 μm.

3. The carrier-attached copper foil according to claim 2, wherein the ten point average roughness Rz of the surface on the side of the ultra-thin copper layer is 0.12 to 1.8 μm.

4. The carrier-attached copper foil according to claim 1, wherein the number of crystal grains per unit cross-sectional area of the ultra-thin copper layer in the through-thickness direction is 0.2 to 4.8 grains/μm².

5. The carrier-attached copper foil according to claim 4, wherein the number of crystal grains per unit cross-sectional area of the ultra-thin copper layer in the through-thickness direction is 0.3 to 4.5 grains/μm².

6. The carrier-attached copper foil according to claim 1, wherein the number of crystal grains per unit cross-sectional area of the ultra-thin copper layer in the through-thickness direction is 0.1-1.15 grains/μm².

7. The carrier-attached copper foil according to claim 1, wherein the average grain size of crystal grains that form the ultra-thin copper layer is 0.5 to 6.0 μm in the cross section taken in the direction parallel to the through-thickness direction of the ultra-thin copper layer.

8. The carrier-attached copper foil according to claim 7, wherein the average grain size of crystal grains that form the ultra-thin copper layer is 0.6 to 5.8 μm in the cross section taken in the direction parallel to the through-thickness direction of the ultra-thin copper layer.

9. The carrier-attached copper foil according to claim 8, wherein the average grain size of crystal grains that form the ultra-thin copper layer is 0.7 to 5.6 μm in the cross section taken in the direction parallel to the through-thickness direction of the ultra-thin copper layer.

10. The carrier-attached copper foil according to claim 9, wherein the average grain size of crystal grains that form the ultra-thin copper layer is 1.0 to 5.6 μm in the cross section taken in the direction parallel to the through-thickness direction of the ultra-thin copper layer.

11. The carrier-attached copper foil according to claim 1, wherein the carrier-attached copper foil has at least one layer selected from a group of a roughened layer, a heat-resistant layer, a rustproofing layer, a chromate treated layer, and a silane coupling-treated layer, and
   when the carrier-attached copper foil according to claim 1 has the ultra-thin copper layer on one face of the carrier, the at least one layer is on at least one or both of a surface on a side of the ultra-thin copper layer and a surface on a side of the carrier, or
   when the carrier-attached copper foil according to claim 1 has the ultra-thin copper layer on each of both faces of the carrier, the at least one layer is on one or both of surfaces on sides of the ultra-thin copper layer.

12. The carrier-attached copper foil according to claim 11, wherein the roughened layer is a layer of an alloy including any one or at least one selected from a group consisting of copper, nickel, phosphorus, tungsten, arsenic, molybdenum, chromium, titanium, iron, vanadium, cobalt, and zinc.

13. The carrier-attached copper foil according to claim 11, wherein the carrier-attached copper foil has a resin layer on the at least one layer selected from the group of the roughened layer, the heat-resistant layer, the rustproofing layer, the chromate treated layer, and the silane coupling-treated layer.

14. The carrier-attached copper foil according to claim 1, wherein a resin layer is provided on the ultra-thin copper layer.

15. A laminate comprising the carrier-attached copper foil according to claim 1, and a resin layer or a prepreg layer.

16. A method of manufacturing a printed wiring board comprising:
   providing two layers including a resin layer and a circuit at least once on any one of or both of faces of the laminate according to claim 15; and
   detaching the carrier and the ultra-thin copper layer from the carrier-attached copper foil that forms the laminate after forming the two layers including the resin layer and the circuit.

17. A laminate comprising the carrier-attached copper foil according to claim 1 and a resin,
   wherein a portion or all of edge faces of the carrier-attached copper foil is covered with the resin.

18. A laminate comprising two carrier-attached copper foils according to claim 1 and a resin, wherein the two carrier-attached copper foils are provided on the resin so that a surface on a side of the ultra-thin copper layer of one carrier-attached copper foil of the two carrier-attached copper foils and a surface on a side of the ultra-thin copper layer of another carrier-attached copper foil are exposed.

19. A laminate wherein the carrier-attached copper foil according to claim 1 is laminated from a side of the carrier or a side of the ultra-thin copper layer on a side of the carrier or a side of the ultra-thin copper layer of another carrier-attached copper foil according to claim 1.

20. A method of manufacturing a printed wiring board comprising:

preparing the carrier-attached copper foil according to claim 1 and an insulating substrate;

laminating the carrier-attached copper foil and the insulating substrate;

detaching the carrier from the carrier-attached copper foil after the carrier-attached copper foil and the insulating substrate are laminated to form a copper-clad laminate; and forming a circuit by any one of a semi-additive method, a subtractive method, a partly additive method, and a modified semi-additive method.

21. An electronic device manufacturing method of manufacturing an electronic device by using a printed wiring board manufactured by the method according to claim 20.

22. A method of manufacturing a printed wiring board comprising:

forming a circuit on a surface on a side of the ultra-thin copper layer or a surface on a side of the carrier of the carrier-attached copper foil according to claim 1;

forming a resin layer on the surface on the side of the ultra-thin copper layer or the surface on the side of the carrier of the carrier-attached copper foil so that the circuit is buried;

detaching the carrier or the ultra-thin copper layer after forming the resin layer; and exposing, after detaching the carrier or the ultra-thin copper layer, the circuit that is formed on the surface on the side of the ultra-thin copper layer or the surface on the side of the carrier and is buried in the resin layer by removing the carrier or the ultra-thin copper layer.

23. A method of manufacturing a printed wiring board comprising:

laminating the carrier-attached copper foil according to claim 1 on a resin substrate so as to attach a side of the carrier to the resin substrate;

forming a circuit on the surface on the side of the ultra-thin copper layer of the carrier-attached copper foil;

forming a resin layer on the surface on the side of the ultra-thin copper layer of the carrier-attached copper foil so that the circuit is buried;

detaching the carrier after forming the resin layer; and exposing, after detaching the carrier, the circuit that is formed on the surface on the side of the ultra-thin copper layer and is buried in the resin layer by removing the ultra-thin copper layer.

24. A method of manufacturing a printed wiring board, comprising:

laminating the carrier-attached copper foil according to claim 1 on a resin substrate so as to attach a surface on a side of the ultra-thin copper layer or a surface on a side of the carrier to the resin substrate;

providing two layers including a resin layer and a circuit at least once on the surface on the side of the ultra-thin copper layer or the surface on the side of the carrier of the carrier-attached copper foil, the surface on the side of the ultra-thin copper layer or the surface on the side of the carrier being an opposite side of a side to which the resin substrate is laminated; and detaching the carrier or the ultra-thin copper layer from the carrier-attached copper foil after forming the two layers including the resin layer and the circuit.

\* \* \* \* \*